(12) United States Patent
Morris, III et al.

(10) Patent No.: US 7,907,033 B2
(45) Date of Patent: Mar. 15, 2011

(54) TUNABLE IMPEDANCE MATCHING NETWORKS AND TUNABLE DIPLEXER MATCHING SYSTEMS

(75) Inventors: Arthur S. Morris, III, Raleigh, NC (US); Tao Ye, Lake Forrest, CA (US); Scott Griffith, San Clemente, CA (US)

(73) Assignee: Wispry, Inc., Irvine, CA (US)

( * ) Notice: Subject to any disclaimer, the term of this patent is extended or adjusted under 35 U.S.C. 154(b) by 294 days.

(21) Appl. No.: 11/715,835

(22) Filed: Mar. 8, 2007

(65) Prior Publication Data
US 2008/0055016 A1 Mar. 6, 2008

Related U.S. Application Data

(60) Provisional application No. 60/780,544, filed on Mar. 8, 2006, provisional application No. 60/780,565, filed on Mar. 8, 2006.

(51) Int. Cl.
*H03H 7/38* (2006.01)
(52) U.S. Cl. ............... 333/129; 333/126; 333/132
(58) Field of Classification Search ........... 333/126, 333/129, 132, 32, 263
See application file for complete search history.

(56) References Cited

U.S. PATENT DOCUMENTS

| | | | |
|---|---|---|---|
| 4,851,795 A * | 7/1989 | Beckwith | ............... 333/100 |
| 5,051,643 A | 9/1991 | Dworsky et al. | |
| 5,475,346 A * | 12/1995 | Mullett | ............... 333/25 |
| 5,970,315 A | 10/1999 | Carley et al. | |
| 6,040,611 A | 3/2000 | De Los Santos et al. | |
| 6,127,908 A | 10/2000 | Bozler et al. | |
| 6,143,997 A | 11/2000 | Feng et al. | |
| 6,198,441 B1 | 3/2001 | Okabe et al. | |
| 6,229,684 B1 | 5/2001 | Cowen et al. | |
| 6,341,039 B1 | 1/2002 | Flanders et al. | |
| 6,347,237 B1 * | 2/2002 | Eden et al. | ............... 505/210 |

(Continued)

FOREIGN PATENT DOCUMENTS
EP 0 419 853 4/1991
(Continued)

OTHER PUBLICATIONS

Harsh, K. F., B. Su, W. Zhang, et al., "The realization and design considerations of a flip-chip integrated MEMS tunable capacitor", Sensors and Actuators A, 80 (2), 2000, pp. 108-118.*

(Continued)

*Primary Examiner* — Robert Pascal
*Assistant Examiner* — Kimberly E Glenn
(74) *Attorney, Agent, or Firm* — Jenkins, Wilson, Taylor & Hunt, P.A.

(57) ABSTRACT

Tunable impedance matching networks and tunable diplexer matching systems are provided. A tunable impedance matching network can include an impedance element connected between first and second nodes for communicating signals between the first and second nodes. For example, the impedance element can be a transmission line or an inductor. Further, the matching network can include a first capacitor connected in parallel with the impedance element, wherein the first capacitor is tunable. The matching network can also include a second capacitor comprising first and second terminals. The first terminal of the second capacitor can be connected to the first node. The second terminal of the second capacitor can be connected to a local voltage reference for the first node. A third capacitor comprises first and second terminals. The first terminal of the second capacitor can be connected to the second node. The second and third capacitors can also be tunable.

30 Claims, 23 Drawing Sheets

U.S. PATENT DOCUMENTS

| | | |
|---|---|---|
| 6,396,368 B1 | 5/2002 | Chow et al. |
| 6,410,361 B2 | 6/2002 | Dhuler et al. |
| 6,466,770 B1 | 10/2002 | Griffith et al. |
| 6,495,387 B2 | 12/2002 | French |
| 6,496,351 B2 | 12/2002 | Hill et al. |
| 6,555,201 B1 | 4/2003 | Dhuler et al. |
| 6,555,404 B1 | 4/2003 | Kubena et al. |
| 6,583,374 B2 | 6/2003 | Knieser et al. |
| 6,630,367 B1 | 10/2003 | Kubena et al. |
| 6,646,525 B2 | 11/2003 | Bozler et al. |
| 6,658,265 B1 | 12/2003 | Steel et al. |
| 6,670,864 B2 * | 12/2003 | Hyvonen et al. ............... 333/32 |
| 6,678,943 B1 | 1/2004 | Feng et al. |
| 6,717,496 B2 | 4/2004 | Feng et al. |
| 6,746,891 B2 | 6/2004 | Cunningham et al. |
| 6,812,794 B1 * | 11/2004 | Mori et al. .................... 330/302 |
| 6,815,739 B2 * | 11/2004 | Huff et al. ..................... 257/275 |
| 6,816,714 B2 * | 11/2004 | Toncich ........................ 455/107 |
| 6,825,818 B2 | 11/2004 | Toncich |
| 6,909,589 B2 | 6/2005 | Huff |
| 6,954,623 B2 | 10/2005 | Chang et al. |
| 7,145,415 B2 * | 12/2006 | Sengupta et al. ............. 333/174 |
| 7,453,154 B2 * | 11/2008 | Teo et al. ...................... 257/777 |
| 2002/0023999 A1 | 2/2002 | Hsu et al. |
| 2002/0055260 A1 | 5/2002 | Chow et al. |
| 2002/0131228 A1 | 9/2002 | Potter |
| 2003/0207487 A1 | 11/2003 | Kubena et al. |
| 2004/0012464 A1 | 1/2004 | Ma et al. |
| 2004/0051584 A1 | 3/2004 | Choi |
| 2005/0095998 A1 | 5/2005 | Toncich |

FOREIGN PATENT DOCUMENTS

| | | |
|---|---|---|
| EP | 0 637 042 | 2/1995 |

OTHER PUBLICATIONS

International Search Report dated Feb. 7, 2008 for International Application No. PCT/US07/05995.

* cited by examiner

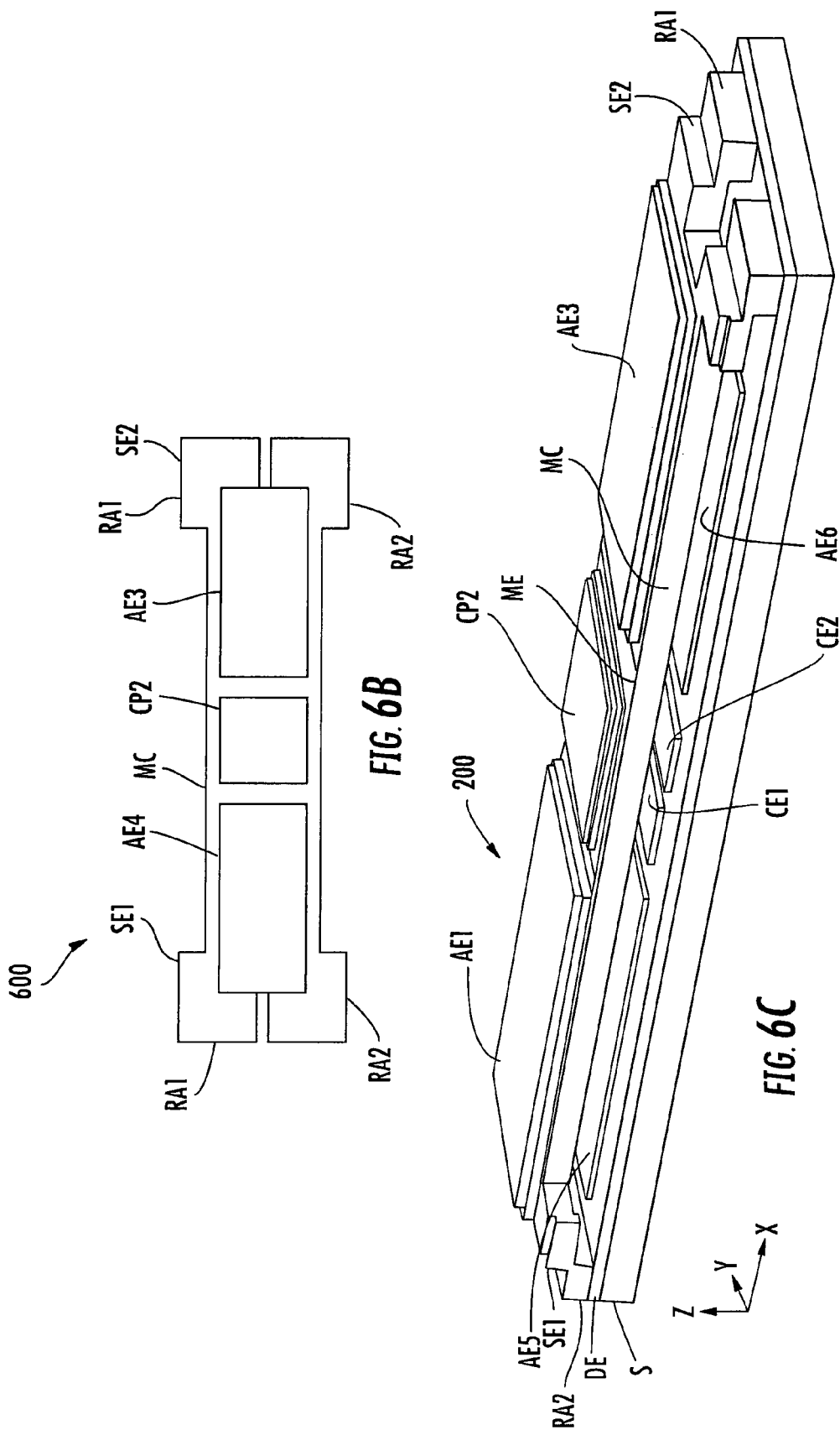

TUNABLE IMPEDANCE MATCHING NETWORKS AND TUNABLE DIPLEXER MATCHING SYSTEMS

RELATED APPLICATIONS

The presently disclosed subject matter claims the benefit of U.S. Provisional Patent Application Ser. No. 60/780,544, filed Mar. 8, 2006, and U.S. Provisional Patent Application Ser. No. 60/780,565, filed Mar. 8, 2006, the disclosures of which are incorporated herein by reference in their entireties.

TECHNICAL FIELD

The subject matter disclosed herein relates to matching networks, systems, and circuits. More particularly, the subject matter disclosed herein relates to tunable impedance matching networks and tunable diplexer matching systems.

BACKGROUND

Matching circuits are widely used to transform the impedance of various components within a circuit either to a target reference impedance (e.g. a transmission line impedance and/or test port) or to directly match two components with different (possibly complex) impedances for optimum power transfer. A matching circuit typically has two nodes for insertion in-line between the components or between a component and a reference impedance. Both nodes of the matching circuit may be carrying a signal in either or both directions through the matching component. The matching function is particularly advantageous for signals at radio frequencies. The matching circuit may precede or follow a component, which has particular input and output impedances when embedded in the circuit. If the component follows the matching circuit in the signal path, the target impedance of the component is its input impedance. If the component precedes the matching circuit in the signal path, the target impedance of the component is its output impedance.

The matching circuit functions to set the impedance seen by the signal to the target impedance by compensating for the difference between the impedance of interest and the target impedance. The compensation of the impedance is determined by the configuration of the matching circuit and the component values of the matching circuit. A wide range of impedance matching and transfer function circuits can be realized by using lumped element inductors or capacitors or both. At higher frequency (above about 1 GHz), it is often advantageous to replace either lumped element inductors or capacitors or both with distributed transmission line networks. Even lumped elements may take on transmission line characteristics at these high frequencies. The usefulness of this replacement is also dependent on the dielectric constant (DK) of the substrate, as well as area constraints.

Different arrangements of matching circuits are known in the art. The selection of the circuit depends on the impedances to be matched. Some examples include series capacitor, shunt capacitor; series capacitor, shunt inductor; series inductor, shunt capacitor; etc. A common configuration for a matching circuit is a sequence of shunt capacitor, series inductor and shunt capacitor known as a pi-network. Transformers, and even resistive networks, can be used, if the insertion loss can be tolerated.

In general, matching circuits should have minimum loss to prevent added degradation in the information signal. Excess loss increases the demands made on other components in an electronic system, especially the active elements such as amplifiers. At the input to a low noise amplifier (LNA), increased signal loss cannot be made up (compensated for) by simply increasing gain of the LNA due to noise considerations. Similarly, signal loss at the output of a power amplifier increases the power consumption of the amplifier to achieve a given output power.

The impedances of the components and the matching circuits are frequency dependent. The impedance can only be perfectly matched at a single operating frequency or optimally matched over a limited band of frequencies. If the designer wishes to operate the device at more than one frequency band, compromises must be made in performance or in circuit complexity. Often, separate signal paths and circuits are used for different frequency bands to enable separate performance optimization. This adds to the cost and size of the circuit and requires of use of signal selection circuitry such as switches or diplexers.

Tunable impedance matching networks can provide an advantage over fixed impedance matching networks. In particular, tunable impedance matching networks can include controllable elements that can be optimally tuned for desired frequencies. Further, tunable impedance matching networks provide an advantage of being able to adapt to environmental and component variations. For example, antenna impedance can vary when objects are positioned near the antenna. Further, impedance can vary based on temperature and based on component manufacture.

In wireless handsets, tunable matching circuits at frequencies above about 200 MHz have proven difficult to achieve. It will be appreciated that a low loss tunable matching network or a tunable diplexer matching system would be beneficial in many applications, but particularly in a portable wireless communication device.

SUMMARY

In accordance with this disclosure, novel tunable impedance matching networks and tunable diplexer matching systems are provided.

It is an object of the present disclosure therefore to provide novel tunable impedance matching networks and tunable diplexer matching systems. This and other objects as may become apparent from the present disclosure are achieved, at least in whole or in part, by the subject matter described herein.

BRIEF DESCRIPTION OF THE DRAWINGS

The subject matter described herein will now be explained with reference to the accompanying drawings of which:

FIGS. 6A-6C are different views of a MEMS variable capacitor according to one embodiment of the subject matter described herein;

DETAILED DESCRIPTION

In accordance with the present disclosure, tunable impedance matching networks and tunable diplexer matching systems are provided. The networks and systems described herein can have particular application for use in impedance matching in radio receiver and transmitter systems, including components such as antennas and amplifiers. The system performance of these components can be very sensitive to impedance mismatching. Improved impedance matching can improve the signal-to-noise ratio, efficiency, stability, linearity and bandwidth of such systems.

A tunable impedance matching network according to the present disclosure can include an impedance element connected between first and second nodes for communicating signals between the first and second nodes. For example, the impedance element can be a transmission line or an inductor. Further, the matching network can include a first capacitor connected in parallel with the impedance element, wherein the first capacitor is tunable. The matching network can also include a second capacitor comprising first and second terminals. The first terminal of the second capacitor can be connected to the first node. The second terminal of the second capacitor can be connected to a third node, which can be a local voltage reference for the first node. A third capacitor comprises first and second terminals. The first terminal of the second capacitor can be connected to the second node. The second terminal of the second capacitor can be connected to a fourth node, which can be a local voltage reference for the second node. One or more of the capacitors can be a micro-electro-mechanical system (MEMS) variable capacitor.

Figure 1A:
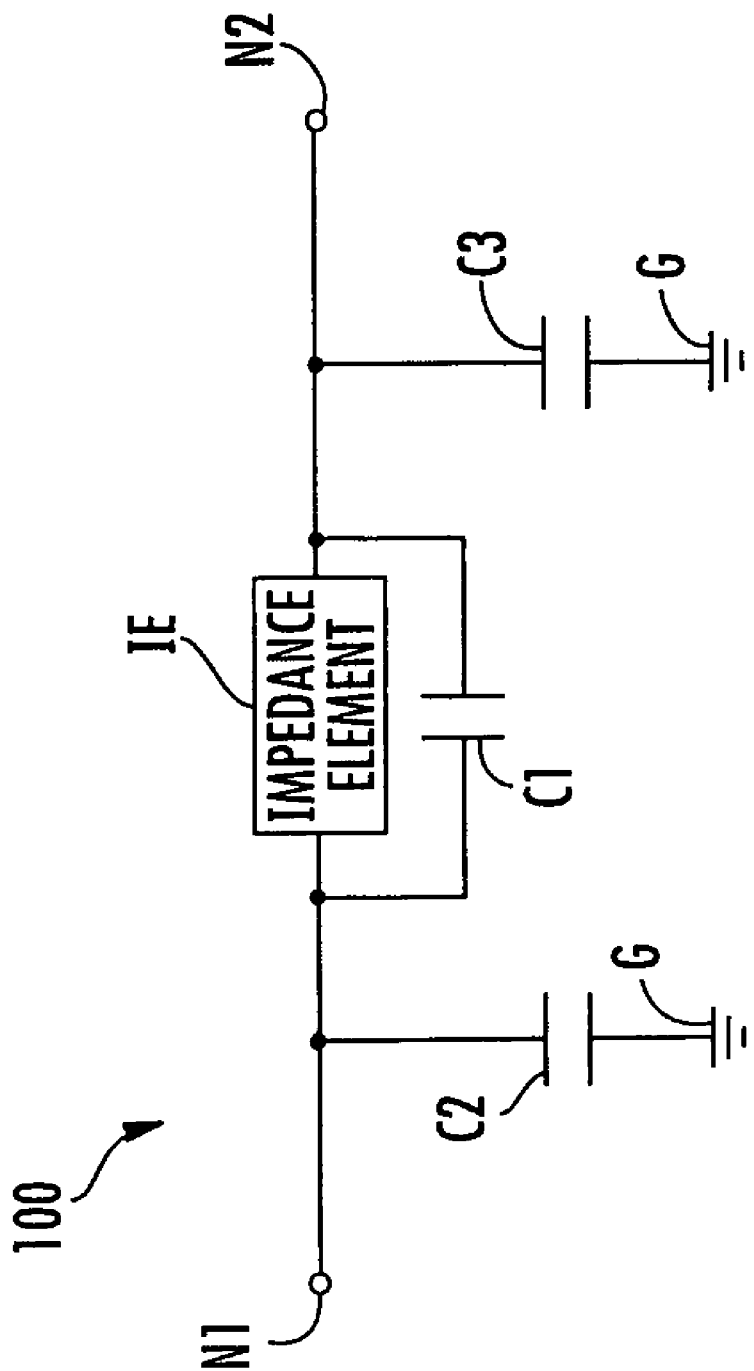
FIG. 1A is a schematic diagram of a tunable impedance matching network according to an embodiment of the subject matter described herein.
Figure 1B:
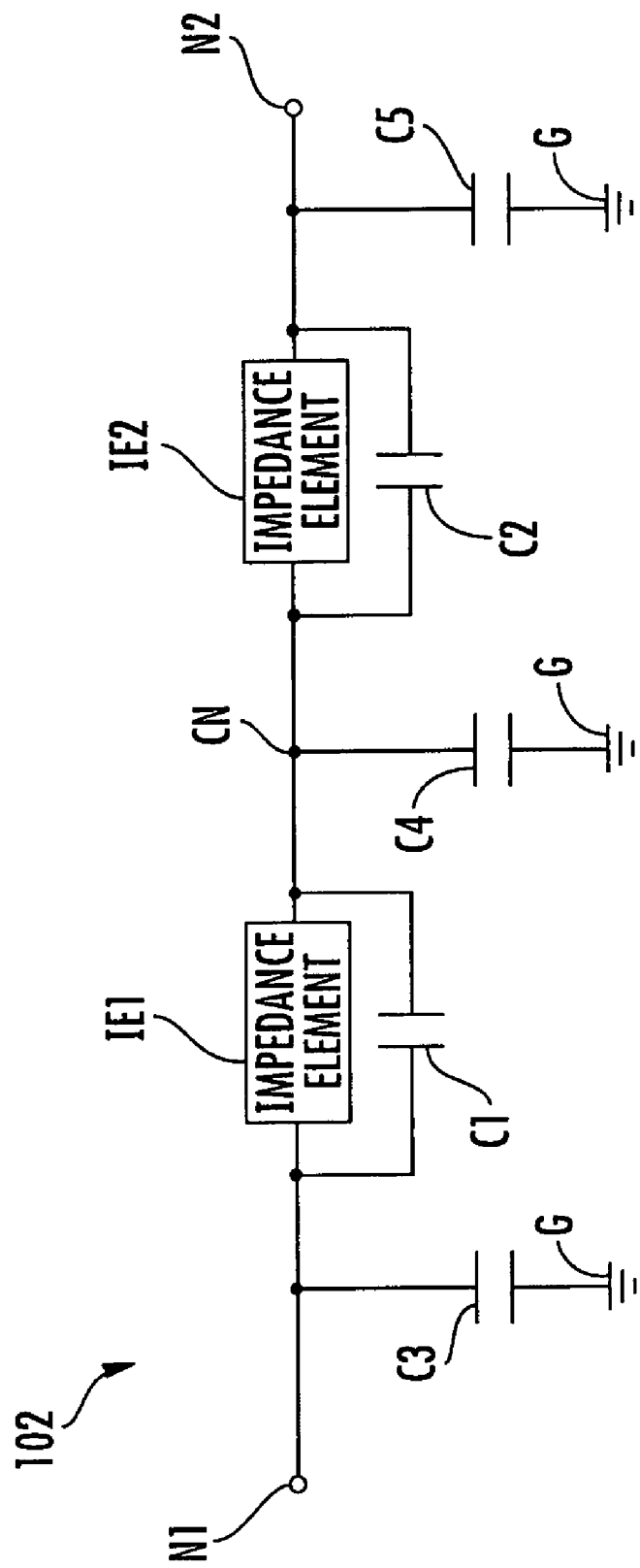
FIG. 1B is a schematic diagram of a tunable impedance matching network according to an embodiment of the subject matter described herein.

FIGS. 1A and 1B are schematic diagrams of tunable impedance matching networks 100 and 102, respectively, according to embodiment of the subject matter described herein. The network of FIG. 1B is a series arrangement of two of the networks shown FIG. 1A with the center capacitor of FIG. 1B being a combination of two capacitors of FIG. 1A. Similarly, three or more of the networks shown in FIG. 1A can be combined in series for achieving desired functionality.

Referring to FIG. 1A, network 100 is configured to correct impedance mismatch between a source and a load. Network 100 may include any suitable number and combination of passive and/or controllable components, which are selected depending on the particular application and device requirements.

Network 100 can include an impedance element IE connected between nodes N1 and N2 for communicating signals between nodes N1 and N2. In one example, nodes N1 and N2 can be connected to a source and a load, respectively. Impedance element IE can have high impedance and may be frequency dependent. For example, impedance element IE can have an impedance magnitude in the range of 1/10 to 10 times the reference impedance with most advantageous range being above the reference impedance. The impedance elements should have very low loss. In one example, the impedance element can be two or more elements that collectively have low loss. In one example, impedance element IE can be an inductor. In one example, impedance elements IE can be a transmission line. Transmission lines can be used as matching elements for matching one characteristic impedance to another.

As referred to herein, standing wave ratio (SWR) is the ratio of the amplitude of a partial standing wave at an antinode (maximum) to the amplitude at an adjacent node (minimum). The SWR is usually defined as a voltage ratio called the VSWR (voltage standing wave ratio). It is also possible to define the SWR in terms of current, resulting in the ISWR, which has the same numerical value. The power standing wave ratio (PSWR) is defined as the square of the SWR. The voltage component of a standing wave in a uniform transmission line consists of the forward wave (with amplitude $V_f$) superimposed on the reflected wave (with amplitude $V_r$).

Capacitor C1 can be connected in parallel with impedance element IE. Capacitor C1 can be a variable capacitor. The nominal capacitance range of capacitor C1 can be between 1 femto-farad and 100 pico-farads for applications using frequencies above 200 MHz. It will be understood by those of skill in the art that the appropriate capacitance range depends on the intended frequency range with larger capacitances required for operation at lower frequencies and vice versa. Further, capacitor C1 can be tuned by application of a control signal, such as by controlling a voltage applied to the capacitors or by actuating a selection of capacitors in a capacitor array. The tuning ratio of the capacitors should be as high as possible with a ratio of greater than 2 required and a ratio greater than 5 preferred.

Network 100 can also include capacitors C2 and C3. One terminal of capacitor C2 is connected to node N1. The other terminal of capacitor C2 is connected to a local voltage reference (a ground G) for node N1. One terminal of capacitor C3 is connected to node N2. The other terminal of capacitor C3 is connected to a local voltage reference (ground G) for node N2.

One or more of capacitors C1-C3 can be variable capacitors. In one embodiment, capacitors C1-C3 can be MEMS variable capacitors. Examples of suitable MEMS variable capacitors are provided hereinbelow. The capacitance range of capacitors C1-C3 can be between can be between 1 femto-farad and 100 pico-farads for applications using frequencies above 200 MHz. It will be understood by those of skill in the art that the appropriate capacitance range for a given application depends on the intended frequency range with larger capacitances required for operation at lower frequencies and vice versa. Further, capacitors C1-C3 can be tuned by application of a control signal, such as by controlling a voltage applied to the capacitors or by actuating a selection of capacitors in a capacitor array. The tuning ratio of the capacitors should be as high as possible with a ratio of greater than 2 required and a ratio greater than 5 preferred.

In the embodiment of network 100 having tunable capacitors, the single network 100 can be used to cover wide frequency ranges and large VSWR variations. Further, network 100 and/or MEMS can be fabricated in low temperature co-fired ceramic (LTCC) substrate, laminated organic substrate, printed circuit board (PCB), or any other suitable substrate or material. Impedance elements can also be discrete elements, such as inductors mounted on a PCB.

Referring to FIG. 1B, network 102 is configured to correct impedance mismatch between a source and a load. Network 102 may include any suitable number and combination of passive and/or controllable components, which are selected depending on the particular application and device requirements.

Network 102 can include impedance elements IE1 and IE2 connected between nodes N1 and N2 for communicating signals between nodes N1 and N2. In one example, nodes N1 and N2 can be connected to a source and a load, respectively. In one example, impedance elements IE1 and IE2 can be inductors. In one example, impedance elements IE1 and IE2 can be transmission lines of suitable length and characteristic impedance.

Capacitors C1 and C2 can be connected in parallel with impedance elements IE1 and IE2, respectively. Capacitors C1 and C2 can be variable capacitors. In one embodiment, capacitors C1 and C2 can be MEMS variable capacitors. Examples of suitable MEMS variable capacitors are provided hereinbelow. The tuning ratio of the capacitors should be as high as possible with a ratio of greater than 2 required and a ratio greater than 5 preferred.

Network 100 can also include capacitors C3, C4, and C5. One terminal of capacitor C3 is connected to node N1. The other terminal of capacitor C3 is connected to a local voltage reference (ground G) for node N1. One terminal of capacitor C4 is connected to a connection node CN between impedance elements IE1 and IE2. The other terminal of capacitor C4 is connected to a local voltage reference (ground G) for connection node CN. One terminal of capacitor C5 is connected to node N2. The other terminal of capacitor C5 is connected to a local voltage reference (ground G) for node N2.

One or more of capacitors C1-C5 can be variable capacitors. In one embodiment, capacitors C1-C5 can be MEMS variable capacitors. Examples of suitable MEMS variable capacitors are provided hereinbelow. Further, capacitors C1-C5 can be tuned by application of a control signal, such as by controlling a voltage applied to the capacitors or by actuating a selection of capacitors in a capacitor array. The tuning ratio of the capacitors should be as high as possible with a ratio of greater than 2 required and a ratio greater than 5 preferred.

In the embodiment of network 102 having tunable capacitors, the single network 102 can be used to cover wide frequency ranges and large VSWR variations. Further, network 100 can be easily fabricated in low temperature co-fired ceramic (LTCC) substrate, laminated organic substrate, printed circuit board (PCB), or any other suitable substrate or material.

One exemplary advantage of networks such as networks 100 and 102 shown in FIGS. 1A and 1B, respectively, is that a decrease in mismatch loss between dissimilar impedances is achieved in applications such as radio electronics and antennas in a cell phone. Another exemplary advantage is that such a network can provide variable impedance matching between a power amplifier output and an antenna for providing optimal power transfer and minimizing output intermodulation distortion.

Figure 1C:
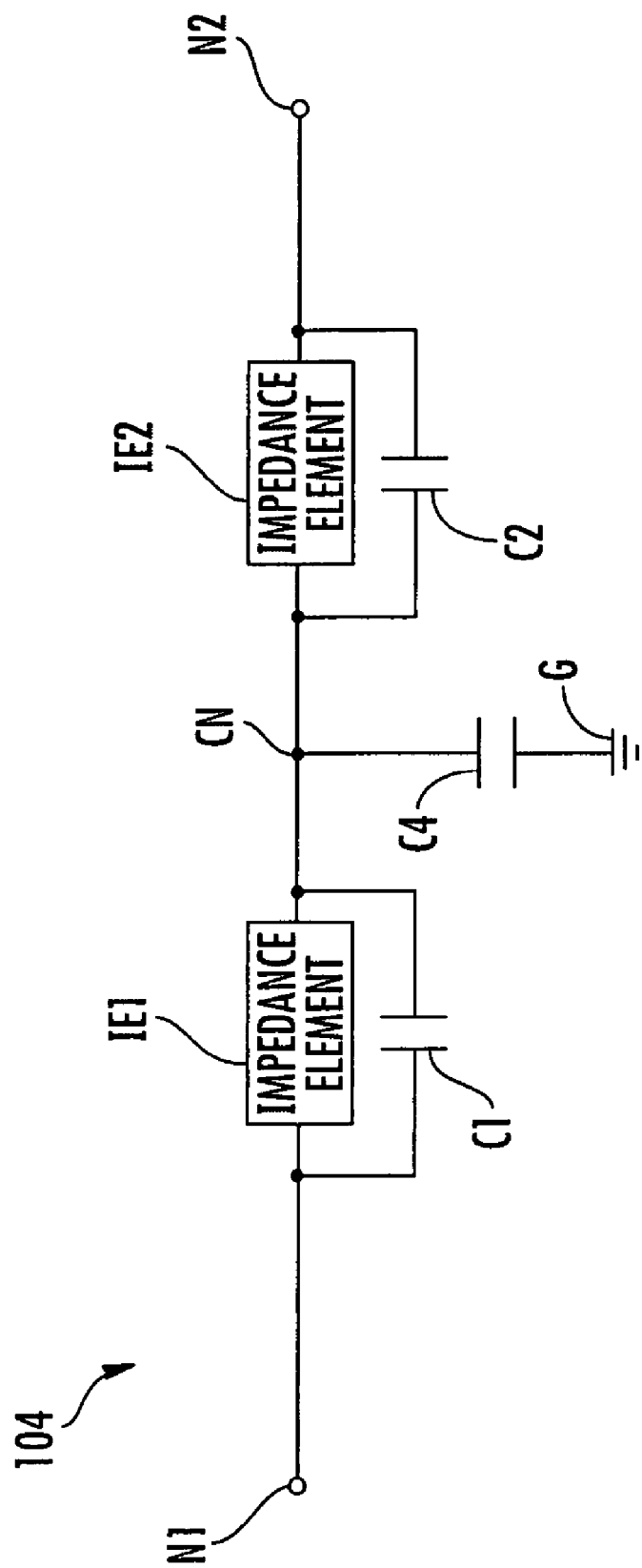
FIG. 1C is a schematic diagram of a tunable matching network according to an embodiment of the subject matter described herein.
Figure 1D:
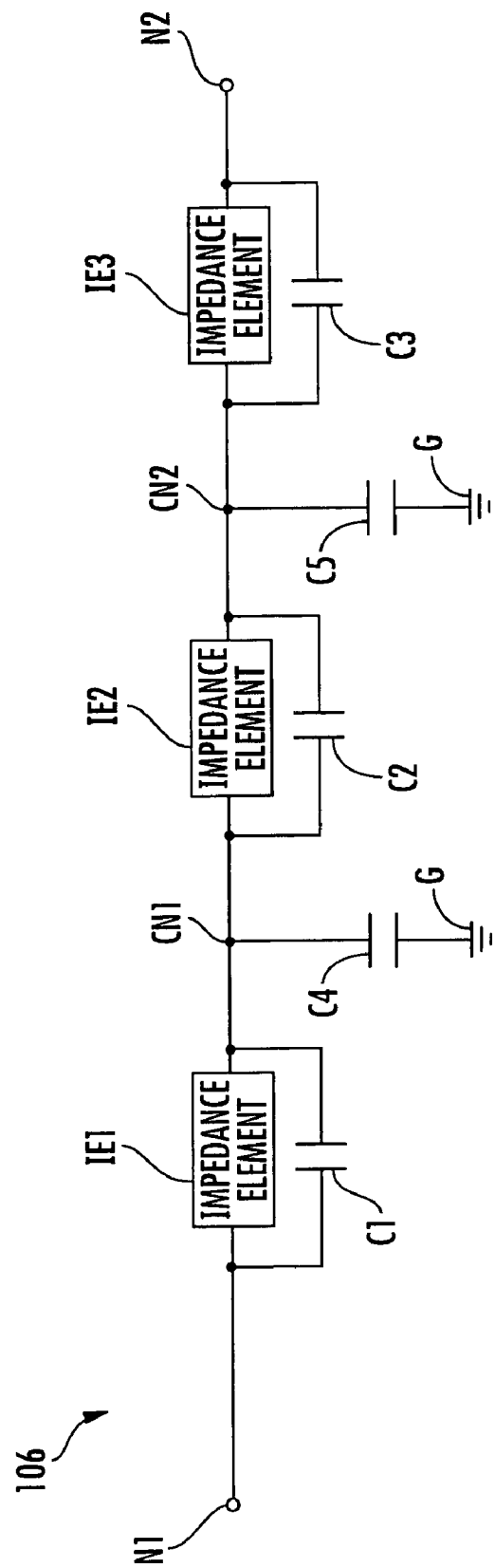
FIG. 1D is a schematic diagram of a tunable matching network according to an embodiment of the subject matter described herein.

FIGS. 1C and 1D are schematic diagrams of tunable impedance matching networks 104 and 106 according to an embodiment of the subject matter described herein. The network of FIG. 1D is a series arrangement of two of the networks shown in FIG. 1C with the center impedance element and capacitor of FIG. 1D being a combined series-connected impedance element and capacitor of FIG. 1C. Similarly, three or more of the networks shown in FIG. 1C can be combined in series for achieving desired functionality.

Referring to FIG. 1C, network 104 can include impedance elements IE1 and IE2 for communicating signals between nodes N1 and N2. In one example, nodes N1 and N2 can be connected to a source and a load, respectively. Impedance elements IE1 and IE2 can be transmission lines or inductors. Further, impedance elements IE1 and IE2 can be connected in parallel with capacitors C1 and C2. Another capacitor C3 can be connected at one terminal to connection node CN and at its other terminal to a local voltage reference (ground G) for connection node CN. One or more of capacitors C1-C3 can be a variable capacitor, such as a suitable MEMS variable capacitor. Network 104 can be configured with components of suitable values for forming a high or low pass filter.

Referring to FIG. 1D, matching network 106 functions as high and low pass filters that together form a bandpass filter for signals communicated between nodes N1 and N2. Network 106 can include impedance elements IE1-IE3 connected together in series between nodes N1 and N2. Impedance elements IE1-IE3 can be connected in parallel with capacitors C1-C3, respectively. Further, a capacitor C4 can be connected to at one terminal to a connection node CN1 and at its other terminal to a local voltage reference (ground G) for connection node CN1. A capacitor C5 can be connected to at one terminal to a connection node CN2 and at its other terminal to a local voltage reference (ground G) for connection node CN2.

Figure 2A:
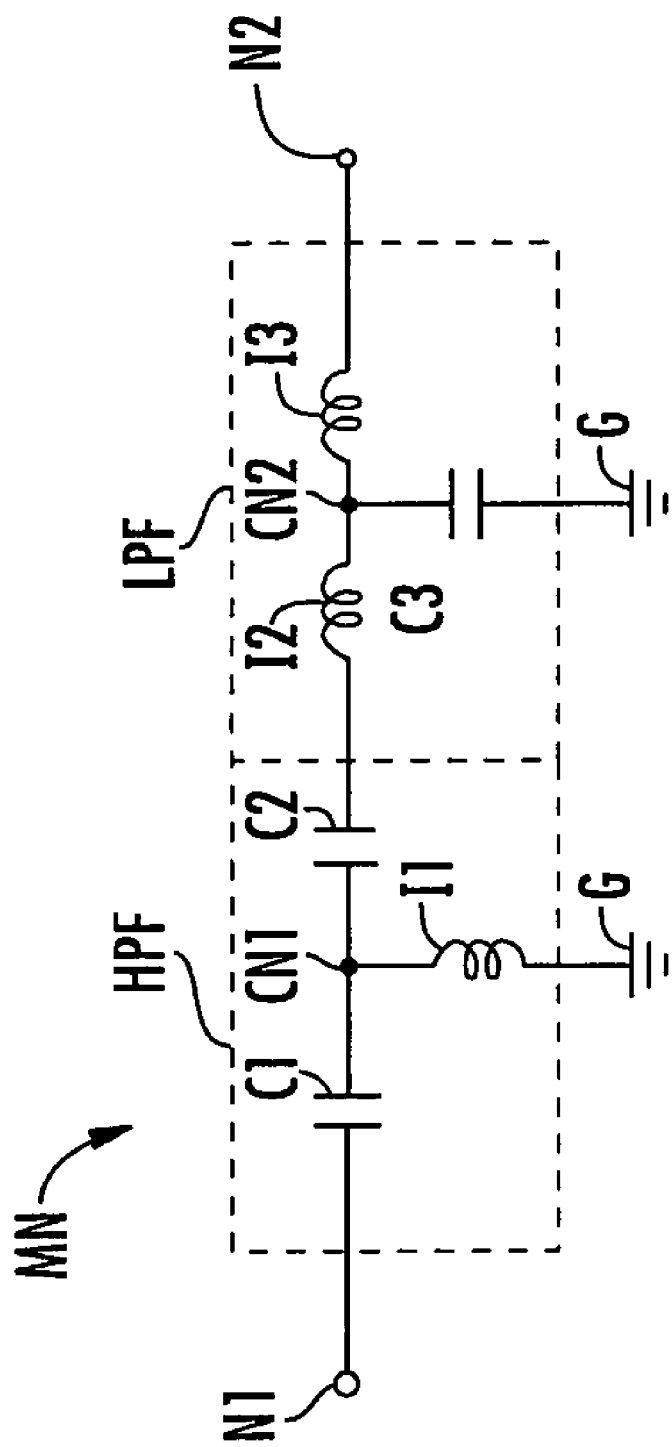
FIG. 2A is a schematic diagram of a tunable impedance matching network according to an embodiment of the subject matter described herein.

FIG. 2A is a schematic diagram of a tunable impedance matching network MN according to an embodiment of the subject matter described herein. Referring to FIG. 2A, matching network MN can include a high pass filter section HPF and a low pass filter section LPF. High pass filter section HPF and low pass filter section LPF collectively form a bandpass filter. In particular, high pass filter section HPF and low pass filter section LPF of matching network MN form a bandpass filter for signals communicated between nodes N1 and N2 of matching network MN.

High pass filter HPF can include capacitors C1 and C2 connected in series between node N1 and low pass filter LPF. In particular, capacitor C1 of matching network MN1 is connected at one terminal to node N1. Further, high pass filter HPF can include an inductor I1 connected at one terminal to a connection node CN1 between capacitors C1 and C2. The other terminal of inductor I1 can be connected to a local voltage reference (ground G) for connection node CN1.

Low pass filter LPF can include inductors I2 and I3 connected in series between a node and a node N2. In particular, inductor I2 of matching network MN is connected at one terminal to high pass filter HPF of matching network MN. Further, low pass filter HPF can include a capacitor C3 connected at one terminal to a connection node CN2 between inductor I2 and I3. The other terminal of capacitor C3 can be connected to a local voltage reference (ground G) for connection node CN2.

One or more of capacitors C1-C3 shown in FIG. 2A can be variable capacitors. In one embodiment, capacitors C1-C3 can be MEMS variable capacitors. Examples of suitable MEMS variable capacitors are provided hereinbelow. Further, capacitors C1-C3 can be tuned by application of a control signal, such as by controlling a voltage applied to the capacitors or by actuating a selection of capacitors in a capacitor array.

A tunable impedance matching system according to the present disclosure can include high and low pass filter sections, which can be combined to form tunable impedance matching networks. One or more tunable impedance matching networks can be connected to a port of a diplexer circuit or multi-plexer circuit for achieving a target impedance over different frequency bands. The high pass filter section can include first and second variable capacitors connected in series between a first and second node. Further, the high pass filter section can include a first inductor comprising first and second terminals. The first terminal of the first inductor can be connected at a connection node between the first and second variable capacitors. The second terminal of the second capacitor can be connected to a third node. The third node can be a local voltage reference to the connection node between the first and second variable capacitors. The low pass filter can include second and third inductors connected in series between the second node and a fifth node. Further, the low pass filter section can include a third variable capacitor comprising first and second terminals. The first terminal of the third variable capacitor can be connected at a connection node between the first and second inductors. The second terminal of the third variable capacitor can be connected to a sixth node. The sixth node can be a local voltage reference to the connection node between the first and second inductors.

Figure 2B:
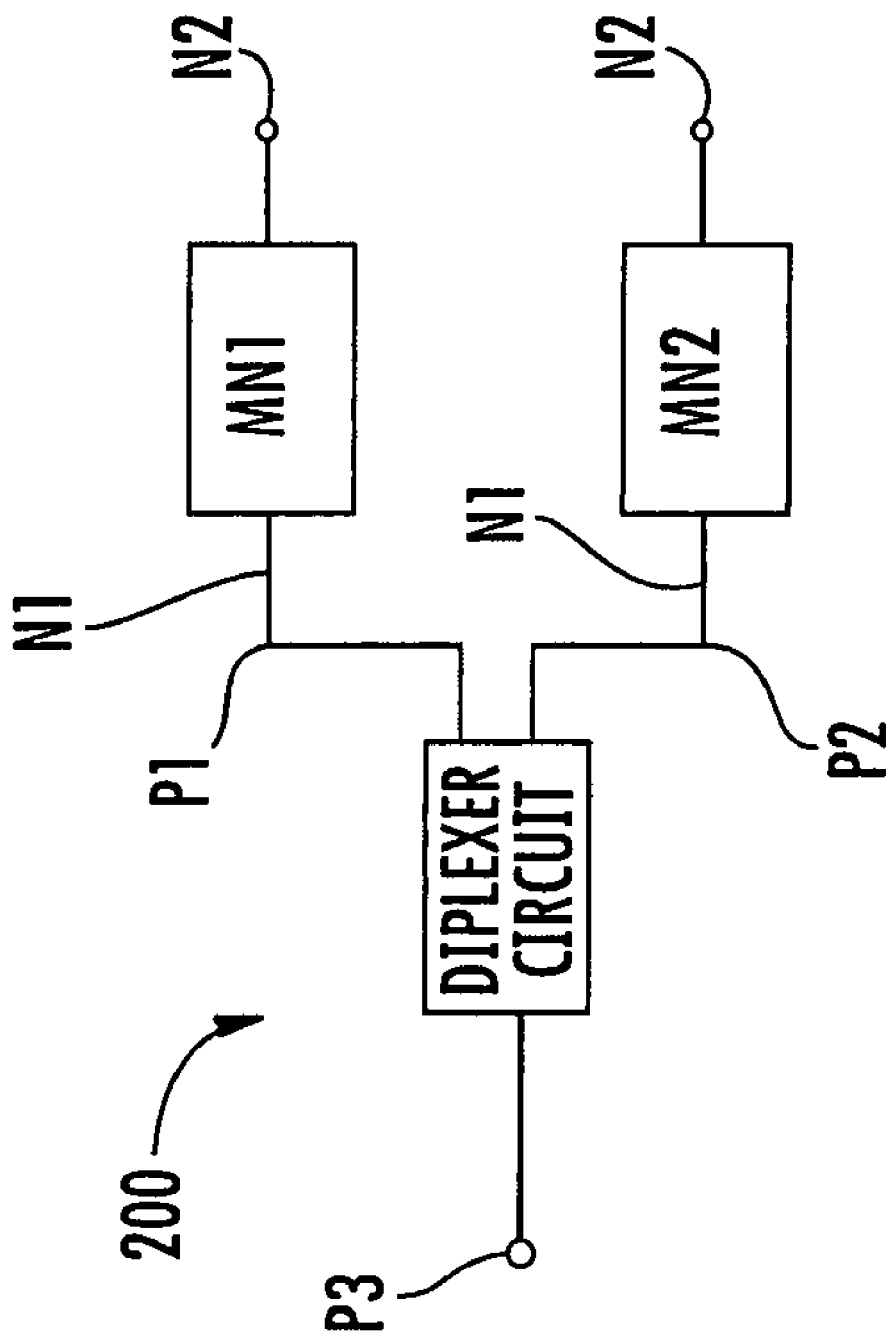
FIG. 2B is a schematic diagram of a tunable diplexer matching system according to an embodiment of the subject matter described herein.

FIG. 2B is a schematic diagram of a tunable diplexer (or multiplexer) matching system 200 according to an embodiment of the subject matter described herein. Referring to FIG. 2B, system 200 can include a diplexer circuit DC comprising a first port P1, a second port P2, and a third port P3. System 200 can also include tunable impedance matching networks MN1 and MN2 connected to ports P1 and P2, respectively. Matching networks MN1 and MN2 can each include a high pass filter section HPF and a low pass filter section LPF as described with respect to FIG. 2A. In another example, matching networks MN1 and MN2 can include one or more tunable impedance matching networks, such as shown in FIGS. 1A and 1B. In another example, matching networks MN1 and MN2 can include matching network 104 as shown FIG. 1C. In another example, matching networks MN1 and MN2 can include a series combination of two or more of matching network 104 as shown FIG. 1C. In yet another example, matching networks MN1 and MN2 can include matching network 106 as shown FIG. 1D.

Figure 3:
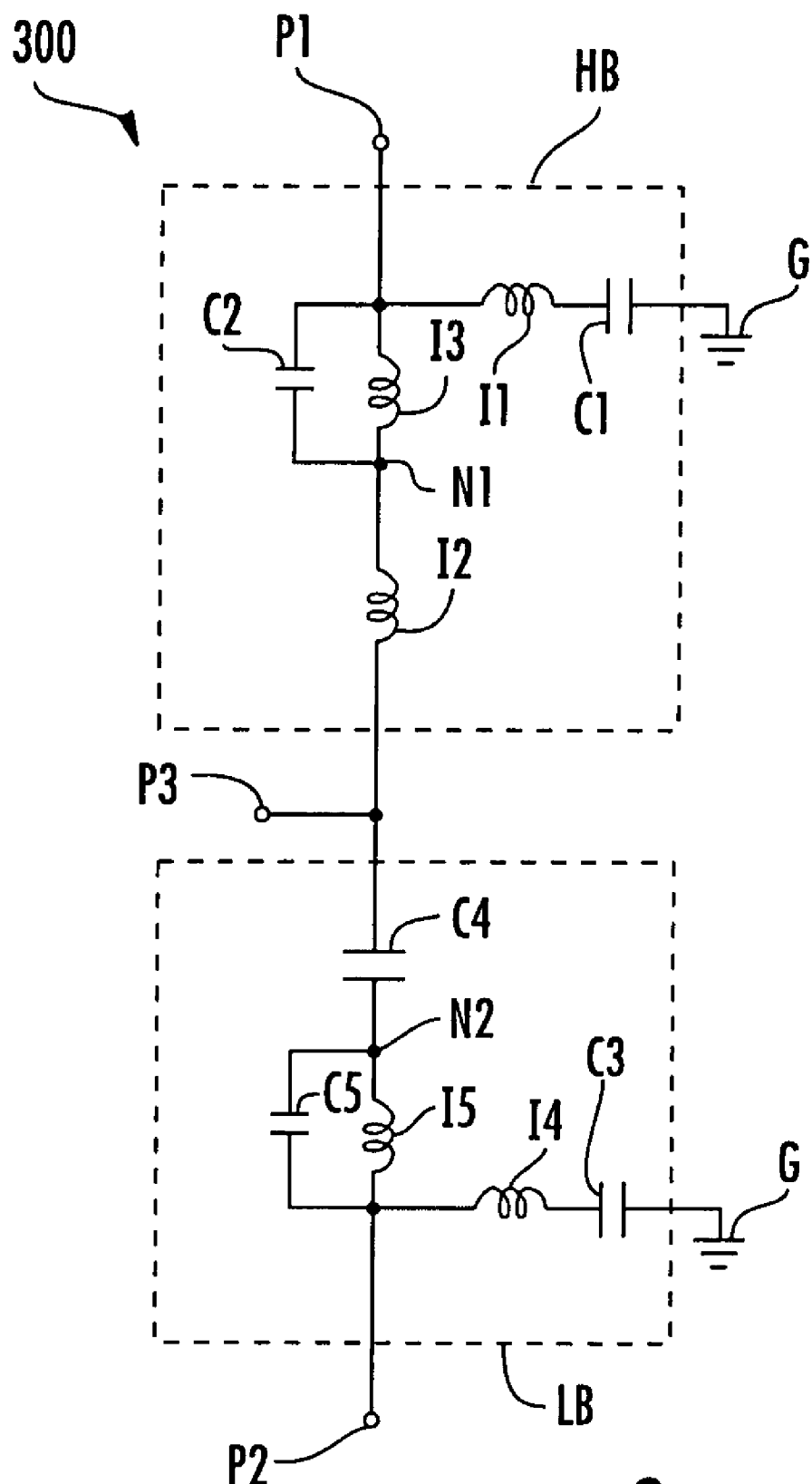
FIG. 3 is a schematic diagram of a diplexer circuit according to an embodiment of the subject matter described herein.

FIG. 3 is a schematic diagram of a diplexer (or multiplexer) circuit generally designated 300 according to an embodiment of the subject matter described herein. Diplexer circuit 300 can be used as the diplexer circuit shown in FIG. 2B with ports P1-P3 of FIG. 3 being connected to ports P1-P3 of FIG. 2B. Referring to FIG. 3, diplexer circuit 300 can include high band circuitry HB connected between ports P1 and P3. Further, diplexer circuit 300 can include low band circuitry LB connected between ports P1 and P2.

High band circuitry HB can include an inductor I1 and a capacitor C1 connected in series between first port P1 and ground G. Further, circuitry HB can include an inductor I2 connected between port P3 and a node N1. Circuitry HB can include an inductor I3 and a capacitor C2 connected in parallel between node N1 and port P1.

Low band circuitry LB can include an inductor I4 and a capacitor C3 connected in series between second port P2 and ground G. Further, circuitry LB can include a capacitor C4 connected between port P3 and a node N2. Circuitry LB can include an inductor I5 and a capacitor C5 connected in parallel between node N2 and port P2.

Figure 4A:
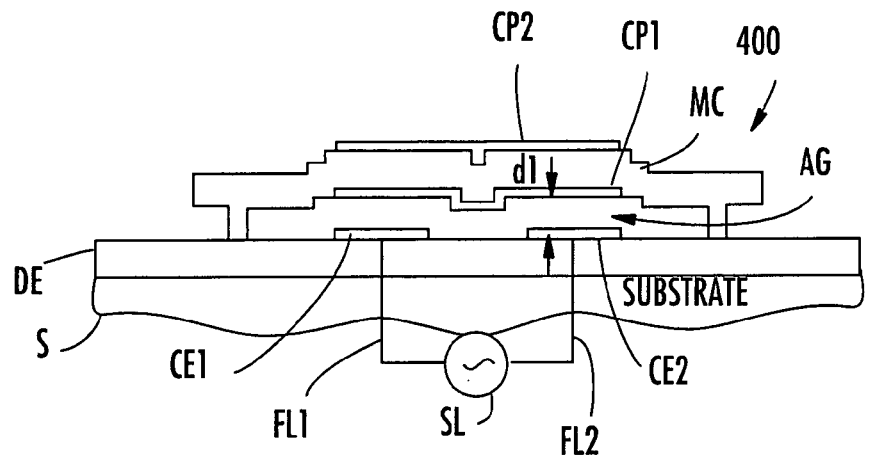
FIGS. 4A-4F are different views of a MEMS variable capacitor according to one embodiment of the subject matter described herein.
Figure 4B:
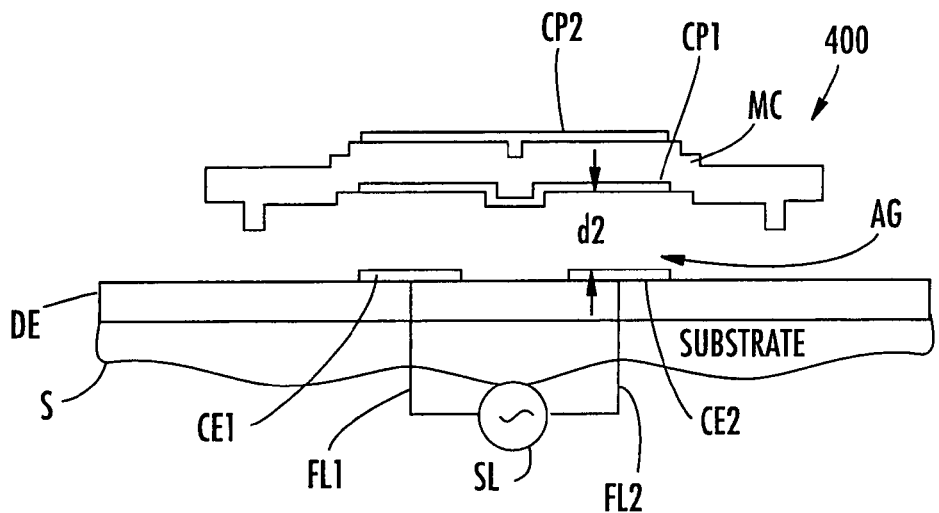

The capacitors shown in FIG. 1-3 can be non-varying capacitors. Alternatively, one or more of the capacitors shown in FIGS. 1-3 can be variable capacitors. In particular, these capacitors can be MEMS variable capacitors. The MEMS variable capacitors referred to herein can be any suitable combination of continuously variable elements, arrays of switched elements and arrays of two-state binary capacitors. FIGS. 4A-4E illustrate different views of a MEMS variable capacitor generally designated 400 according to one embodiment of the subject matter described herein. Generally, MEMS variable capacitor 400 is an actuation component. In particular, FIG. 4A is a cross-sectional front view of variable capacitor 400 in a closed position. Referring to FIG. 4A, switched variable capacitor 400 can include first and second capacitive elements CE1 and CE2 disposed on a surface of a dielectric layer DE. Capacitive elements CE1 and CE2 can be connected to feed lines FL1 and FL2, respectively. Feed lines FL1 and FL2 can be connected to a signal line SL. A first capacitive plate CP1 can be positioned on an opposing side of an air gap AG from capacitive elements CE1 and CE2 to form a capacitance across feed lines FL1 and FL2. First capacitive plate CP1 can be spaced from capacitive elements CE1 and CE2 by a distance d1 in the closed position. The distance between plate CP1 and capacitive elements CE1 and CE2 can be about 0.5 to 4 microns. FIG. 4B is a cross-sectional front view of variable capacitor 400 in an open position, wherein first capacitive plate CP1 can be spaced from capacitive elements CE1 and CE2 by a distance d2. Variable capacitor 400 can include bumps B for preventing capacitive plate CP1 from contacting capacitive elements CE1 and/or CE2. Bumps can be in any number and placed in any suitable positioned on a bottom surface of a movable component for preventing the undesired contact of components. In one example, bumps can be located near capacitive plates. In another example, bumps can be located near actuation electrodes.

Figure 4C:
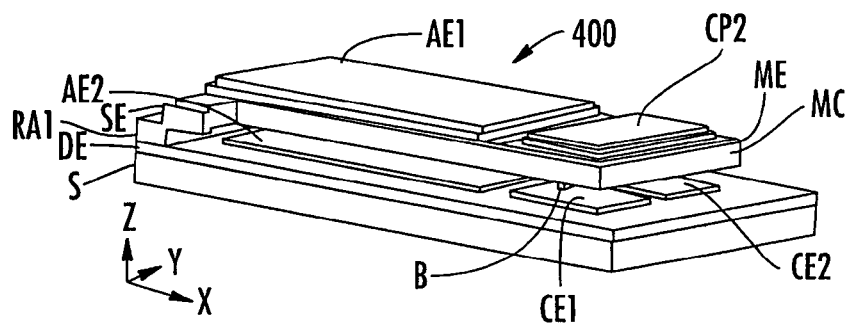

FIG. 4C is a top perspective view of variable capacitor 400. Referring to FIG. 4C, the capacitance of variable capacitor 400 can be varied by applying varying voltage across actuation electrodes AE1 and AE2. When voltage is applied across actuation electrodes AE1 and AE2, a movable end ME of a movable component MC can deflect towards substrate S while a stationary end SE remains stationary due to its attachment to dielectric DE and substrate S. As a result of the deflection, the distance between capacitive plates CP1 and CP2 and capacitive elements CE1 and CE2 narrows, and therefore, the capacitance changes. Variable capacitor 400 can also include an actuation electrode (not shown) on an opposing side of movable component MC from actuation electrode AE1 and electrically connected to actuation electrode AE1 for deflecting movable end ME towards substrate S on application of the voltage.

In one embodiment, variable capacitor 400 can be fabricated on a substrate S and dielectric DE. In particular, for example, feed lines FL1 and FL2 can be buried within substrate S and/or dielectric DE and include ends that extend to a surface of dielectric DE. A conductive layer can be deposited over the top surface of dielectric DE and the ends of feed lines FL1 and FL2. The conductive layer can be etched to form capacitive elements CE1 and CE2 on the ends of feed lines FL1 and FL2, respectively. Further, the conductive layer can be etched to form actuation electrodes AE2.

A sacrificial layer can be deposited on capacitive elements CE1 and CE2 and dielectric DE. Next, apertures A1 and A2 can be etched in the sacrificial layer through to the surface of dielectric DE. Movable component MC can be formed by depositing a layer of oxide on capacitive plate CPI, the sacrificial layer, and in apertures A1 and A2 through to the surface of dielectric DE. The sacrificial layer can be removed to form an air gap between capacitive plate CP1 and capacitive elements CE1 and CE2. The air gap can be varied to achieve different capacitances. Further, a conductive layer can be formed on movable component MC and the conductive layer etched to form a second capacitive plate CP2.

Figure 4D:
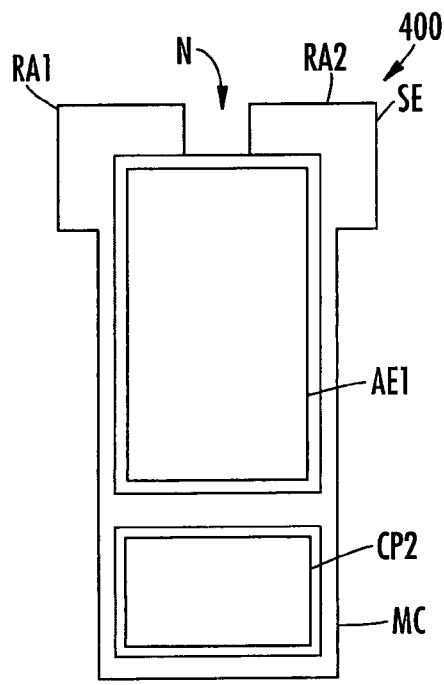

FIG. 4D is a top view of variable capacitor 400. Stationary end SE includes resilient arms RA1 and RA2, which can bend and resist the deflection of movable end ME towards substrate S when voltage is applied across the actuation electrodes. A notched area generally designated N provides spacing between resilient arms RA1 and RA2. The thickness of resilient arms RA1 and RA2 can be varied for increasing or decreasing their resistance to the deflection of movable end ME. Further, the length of resilient arms RA1 and RA2 can be made longer or shorter for increasing or decreasing, respectively, resistance to the deflection of movable end ME.

Figure 4F:
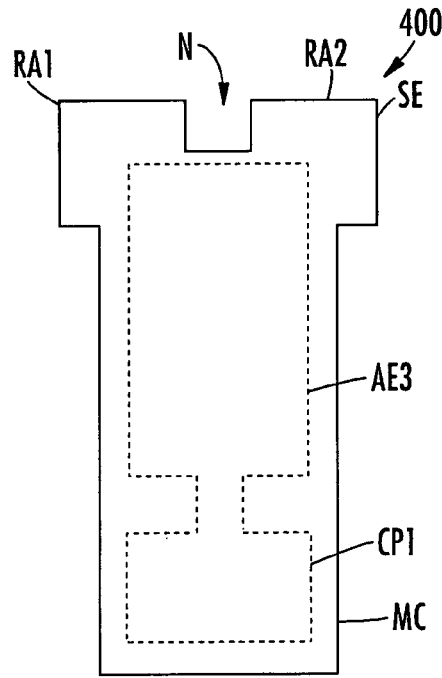
Figure 4E:
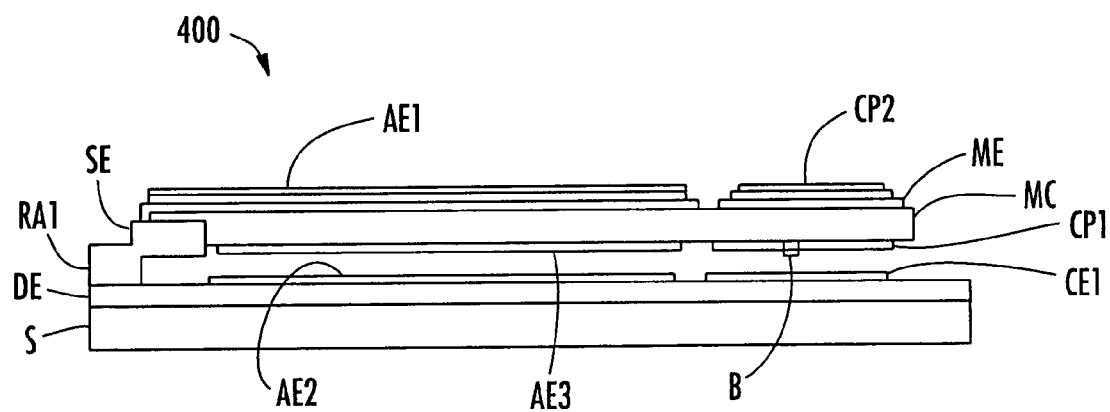

FIG. 4E is a side view of MEMS variable capacitor 400. Variable capacitor 400 can include an actuation electrode AE3 in electrical communication with actuation AE1. A voltage can be applied across second actuation electrode AE2 and first/third actuation electrodes AE1/AE3 for moving movable component MC.

FIG. 4F is another top view of MEMS variable capacitor 400. In this view, actuation electrode AE1 and capacitive plate CP2 are now shown in order to provide a better view of actuation electrode AE3 and capacitive plate CP1 (indicated by broken lines) attached to an underside of movable component MC. Actuation electrode AE3 and capacitive plate CPI can be electrically connected.

Figure 5:
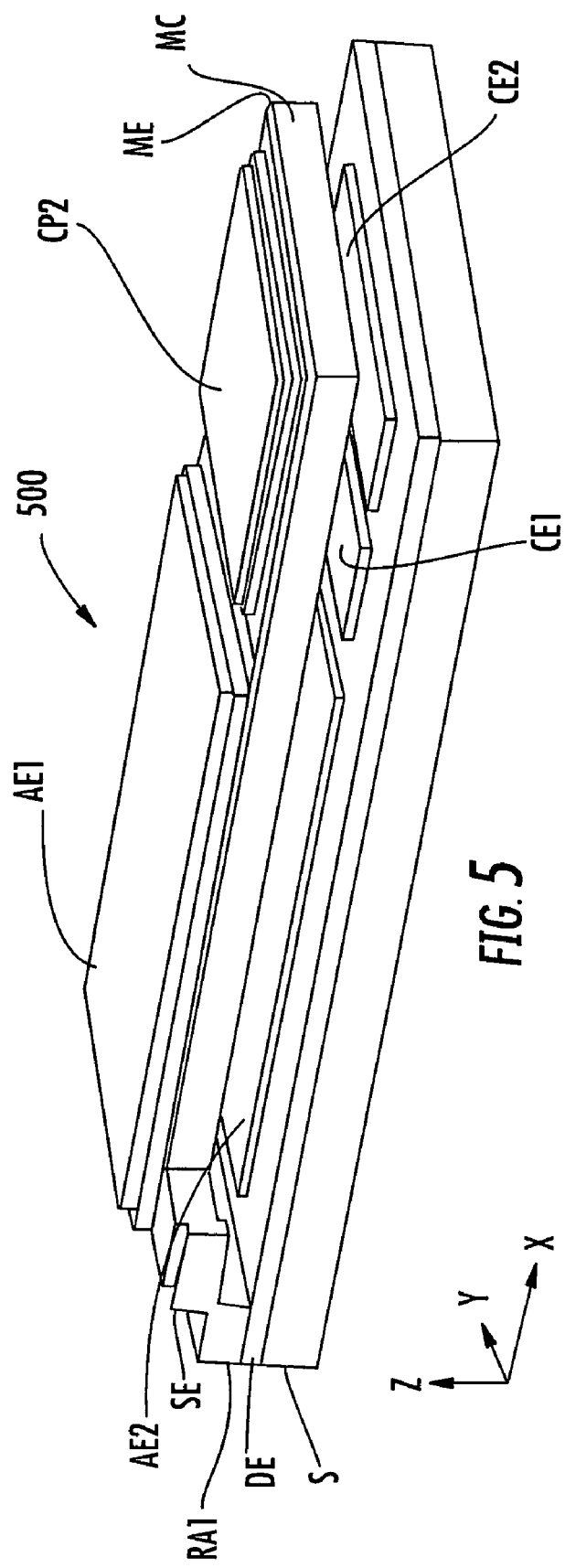
FIG. 5 is a top perspective view of a MEMS variable capacitor according to one embodiment of the subject matter described herein.

FIG. 5 is a top perspective view of a MEMS variable capacitor 500 according to one embodiment of the subject matter described herein. Referring to FIG. 5, variable capacitor 500 is similar to variable capacitor 400 shown in FIG. 4 except for the arrangement of capacitive elements CE1 and CE2 and capacitive plates CP1 and CP2. In particular, capacitive elements CE1 and CE2 are aligned with one another along the length of movable component. Further, capacitive plates CP1 (not shown) and CP2 are extended in length such that they are positioned over capacitive elements CE1 and CE2.

Figure 6A:
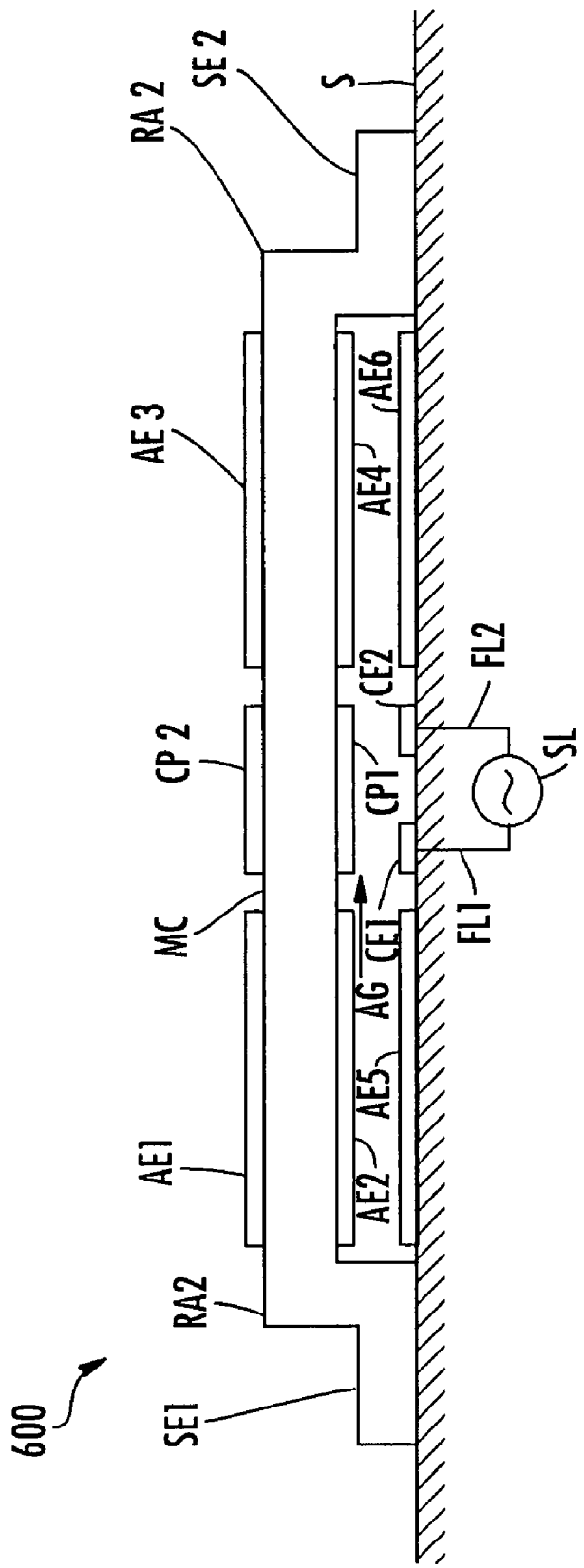

FIGS. 6A and 6B illustrate different views of a MEMS variable capacitor generally designated 600 according to one embodiment of the subject matter described herein. In particular, FIG. 6A is a cross-sectional side view of variable capacitor 600. Referring to FIG. 6A, variable capacitor 600 can include first and second capacitive elements CE1 and CE2 disposed on a surface of a substrate S. Capacitive elements CE1 and CE2 can be connected to feed lines FL1 and FL2, respectively. Feed lines FL1 and FL2 can be connected to signal line SL. First capacitive plate CPI can be positioned on an opposing side of an air gap AG from capacitive elements CE1 and CE2 to form a capacitance across feed lines FL1 and FL2.

The capacitance of variable capacitor 600 can be varied by applying varying voltage across actuation electrodes. In particular, capacitor 600 can include actuation electrodes AE1, AE2, AE3, and AE4 positioned on movable component. Further, actuation electrodes AE5 and AE6 can be positioned on a top surface of substrate S. A voltage difference can be applied between actuation electrode AE5 and AE1 and AE2. Further, a voltage difference can be applied between actuation electrode AE6 and AE3 and AE4. At a sufficiently high voltage difference, a center portion of a movable component MC (the portion at which capacitive plates CP1 and CP2 are attached) can deflect towards substrate S while stationary ends SE1 and SE2 remain stationary due to their attachment to substrate S. As a result of the deflection, the distance between capacitive plates CP1 and CP2 and capacitive elements CE1 and CE2 narrows, and therefore, the capacitance changes.

In one embodiment, variable capacitor 600 can be fabricated on a substrate S. In particular, for example, feed lines FL1 and FL2 can be buried within substrate S and include ends that extend to a surface of substrate S. A conductive layer can be deposited over the top surface of substrate S and the ends of feed lines FL1 and FL2. The conductive layer can be etched to form capacitive elements CE1 and CE2 on the ends of feed lines FL1 and FL2, respectively. Further, the conductive layer can be etched to form actuation electrodes AE5 and AE6.

A sacrificial layer can be deposited on capacitive elements CE1 and CE2, substrate S, and actuation electrodes AE5 and AE6. Next, apertures can be etched in the sacrificial layer through to the surface of substrate S. Movable component MC can be formed by depositing a layer of oxide on capacitive plates CP1 and CP2, the sacrificial layer, actuation electrode AE5 and AE6, and in the apertures A1 and A2 through to the surface of substrate S. The sacrificial layer can be removed to form an air gap between capacitive plates CP1 and CP2 and capacitive elements CE1 and CE2. The air gap can be varied to achieve different capacitances. Further, a conductive layer can, be formed on movable component MC and the conductive layer etched to form a second capacitive plate CP2.

FIG. 6B is a top view of variable capacitor 600. Variable capacitor 300 can include station ends SE1 and SE2. Stationary ends SE1 and SE2 can each include resilient arms RA1 and RA2, which can bend and resist the deflection of movable end ME towards substrate S when voltage is applied across the actuation electrodes. A notched area N provides spacing between resilient arms RA1 and RA2. The thickness of resilient arms RA1 and RA2 can be varied for increasing or decreasing their resistance to the deflection of movable end ME. Further, the length of resilient arms RA1 and RA2 can be made longer or shorter for increasing or decreasing, respectively, resistance to the deflection of movable end ME.

Figure 7:
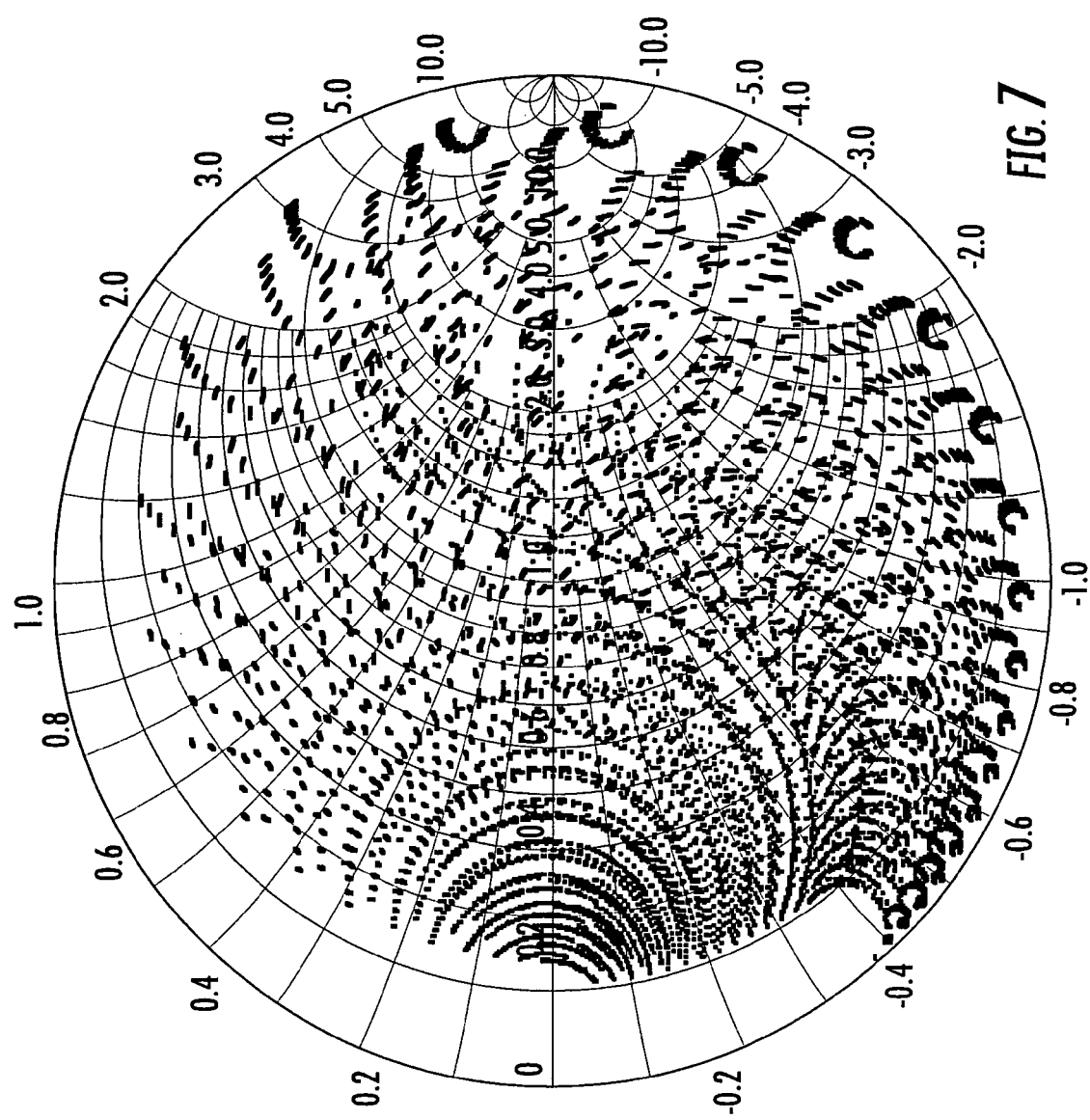
FIGS. 7 and 8 are Smith Charts of simulation results of matching network shown in FIG. 1B.
Figure 8:
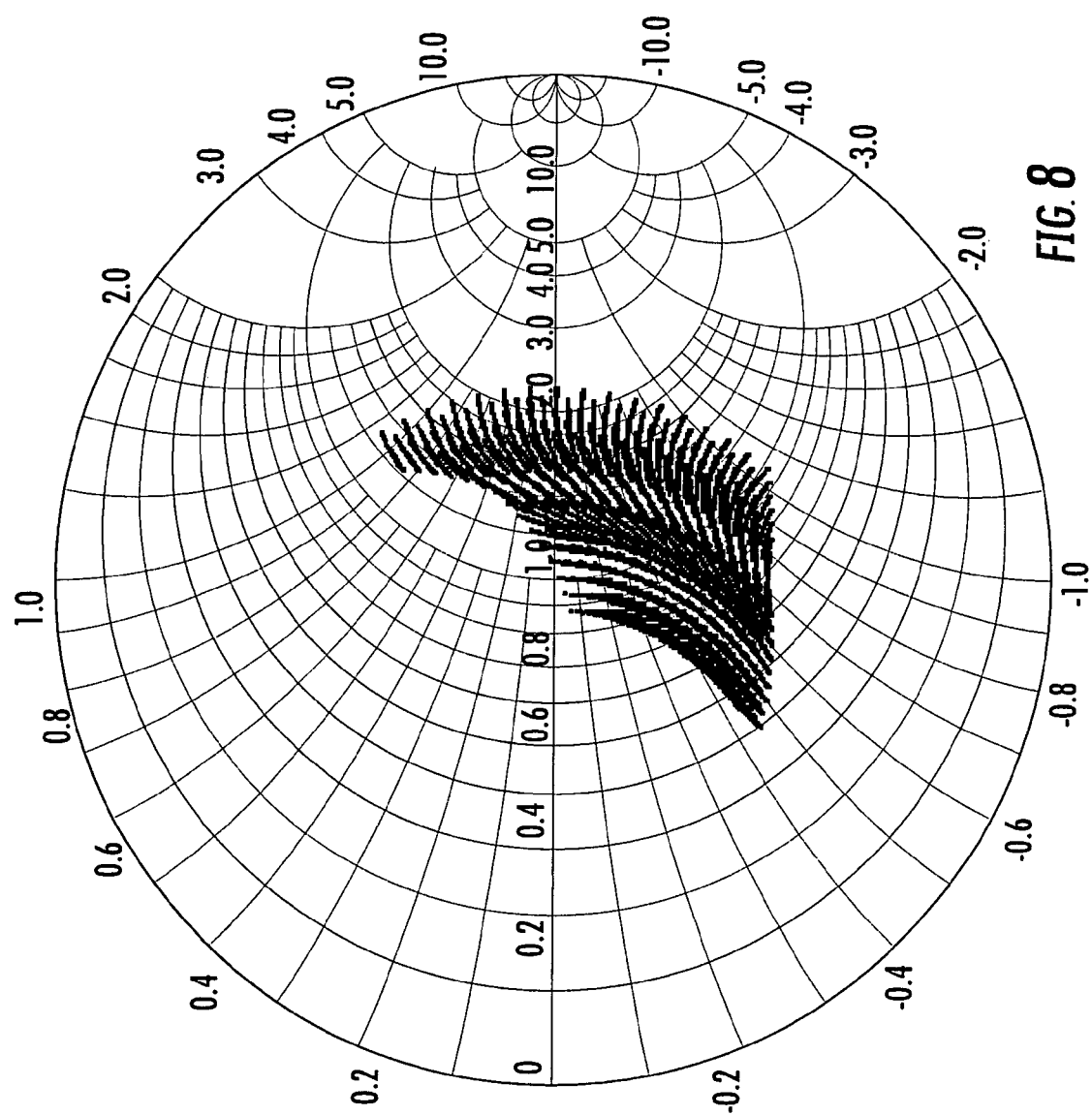

FIGS. 7 and 8 are Smith Charts illustrating simulation results of matching network 100 shown in FIG. 1. These charts show the results of the reflection looking into one terminal of matching network 100 while the other terminal end is connected to a perfectly matched load. The resulting reflection coefficient can optimally tune a load having a reflection coefficient that is the complex conjugate of the network coefficient. These are referred to as coverage maps as the tuning of the variable elements in the network are swept at a single frequency to determine what areas of the Smith Chart can be reached. An ideal result is when the chart is uniformly and fairly densely filled with points showing that a match can be obtained anywhere. FIG. 7 shows an exemplary result for the circuit shown in FIG. 1B using transmission lines for the impedance element and high ratio tunable capacitors. FIG. 8 shows the reduced coverage result for the same circuit but with much lower ratio tunable capacitors.

Figure 9:
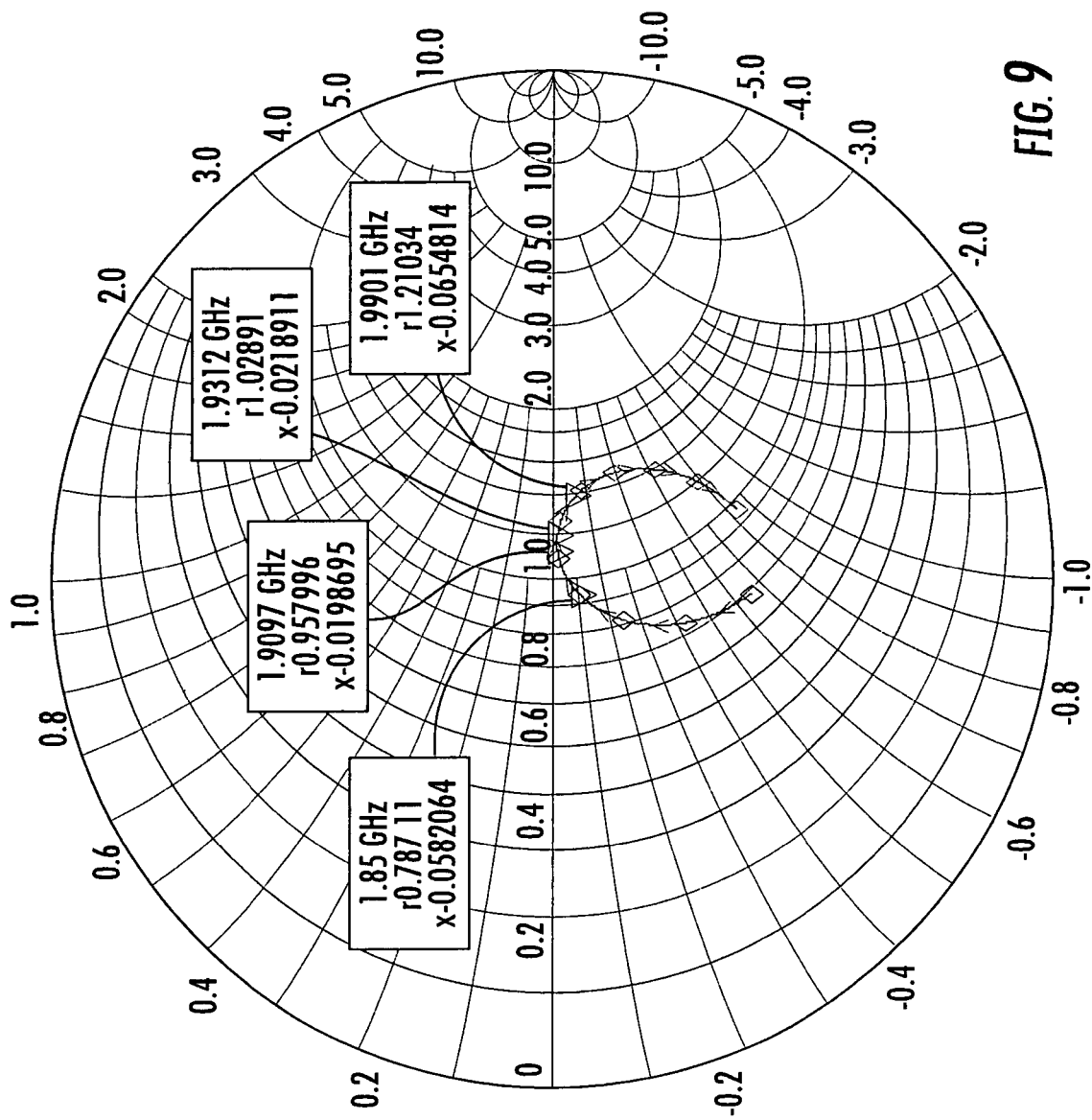
FIGS. 9-16 are Smith Charts of simulation results of system shown in FIG. 2D.
Figure 10:
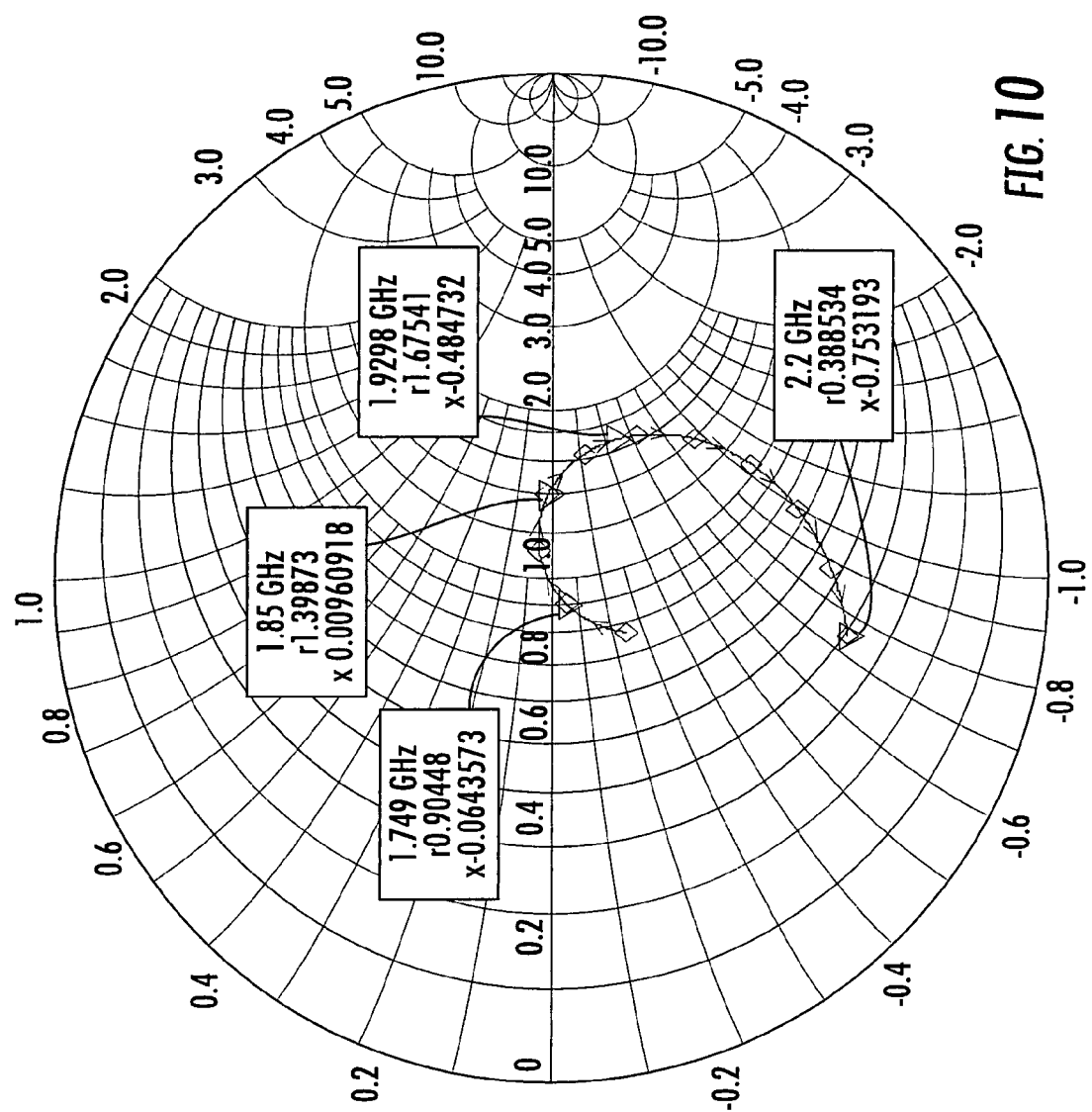
Figure 11:
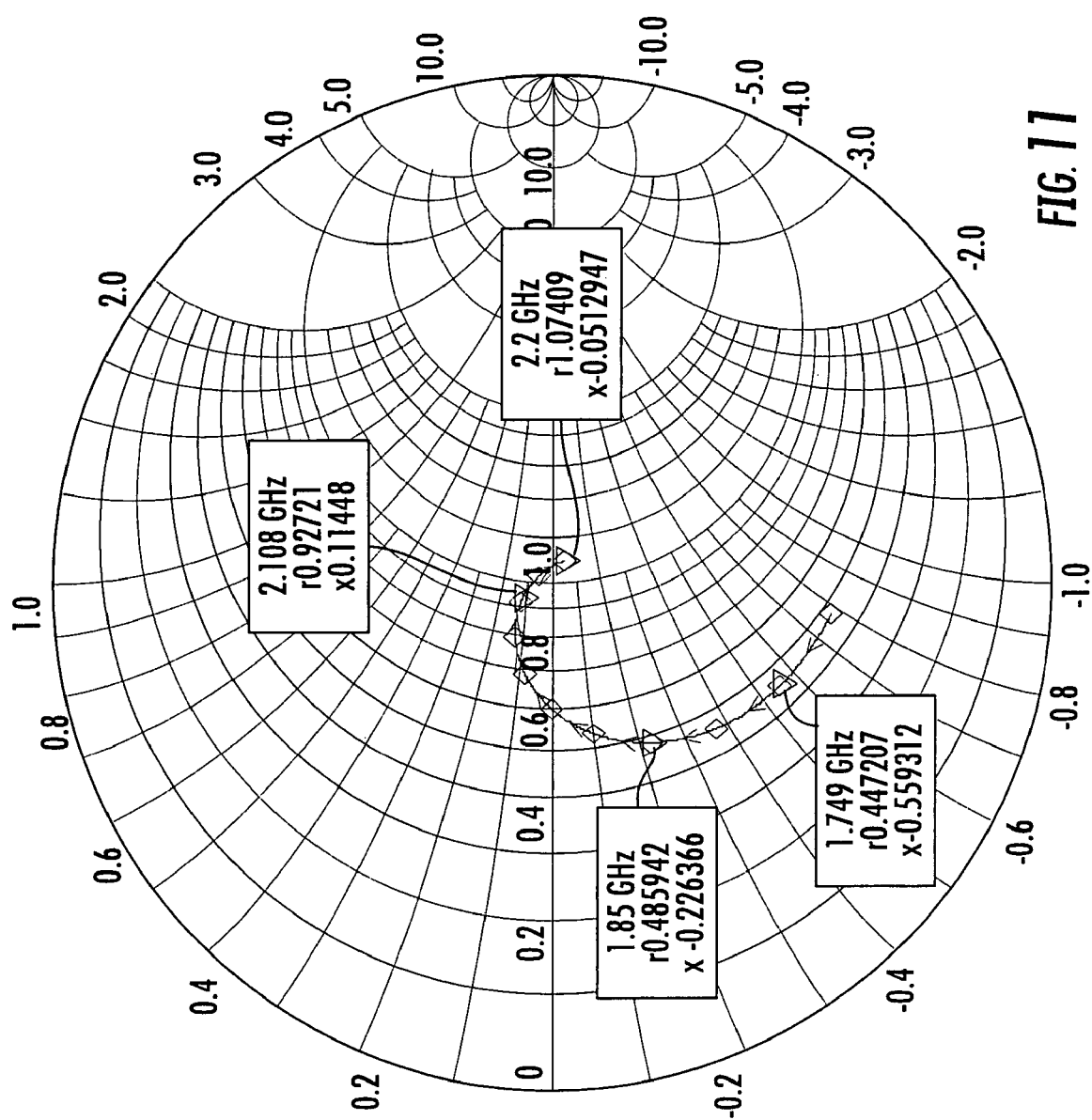
Figure 12:
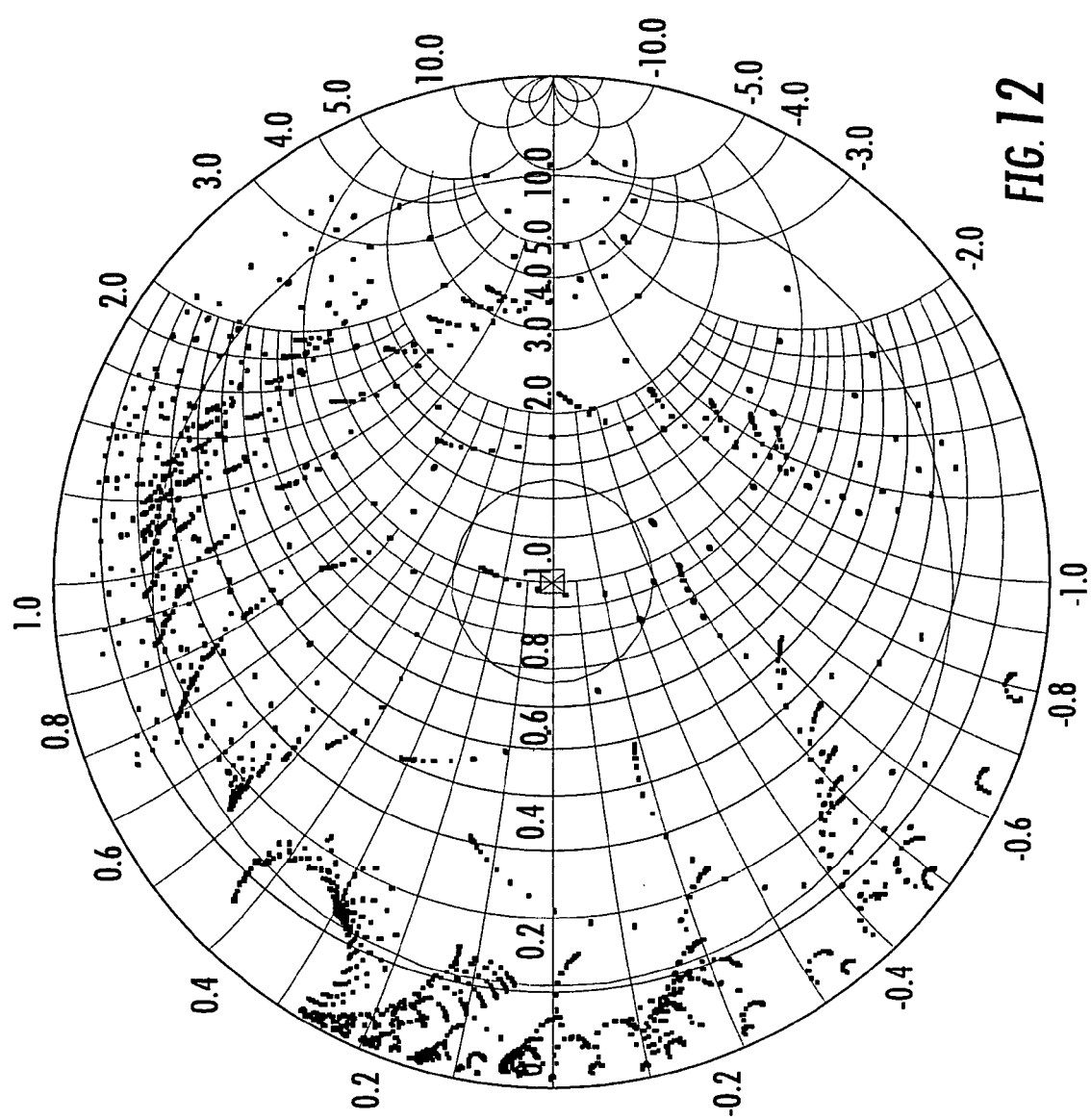
Figure 13:
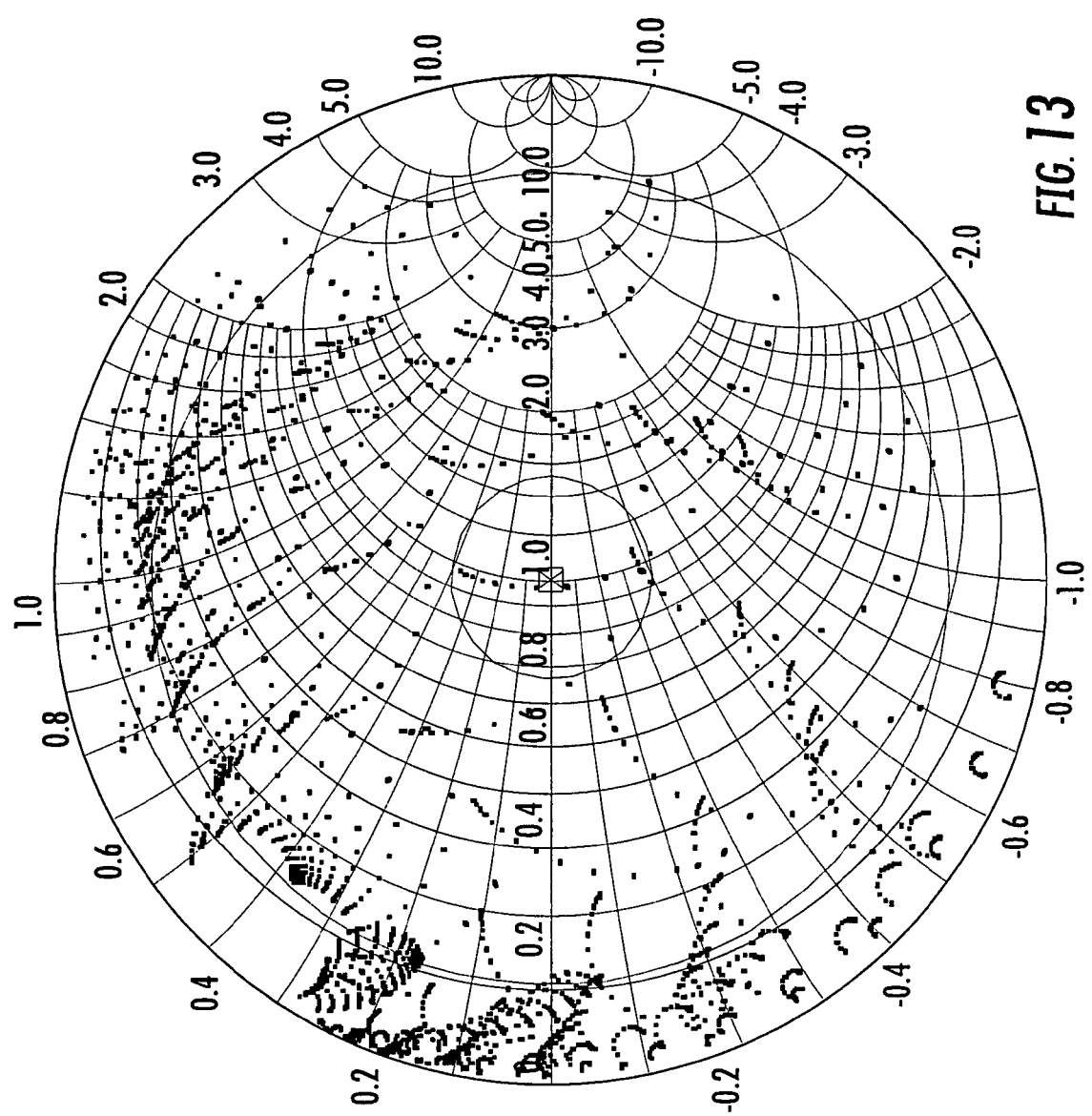

FIGS. 9-16 are Smith Charts illustrating simulation results of system 204 shown in FIG. 2D. The charts of FIGS. 9-11 show the results of the reflection looking into one terminal of system 204 while the other end is connected to a mismatched load (possibly an antenna). In the FIGS. 9-11 charts, the simulation is performed over a range of different frequencies. Note that perfect matching reaching the center of the Smith Chart is, at most, achieved at only one frequency.

Figure 14:
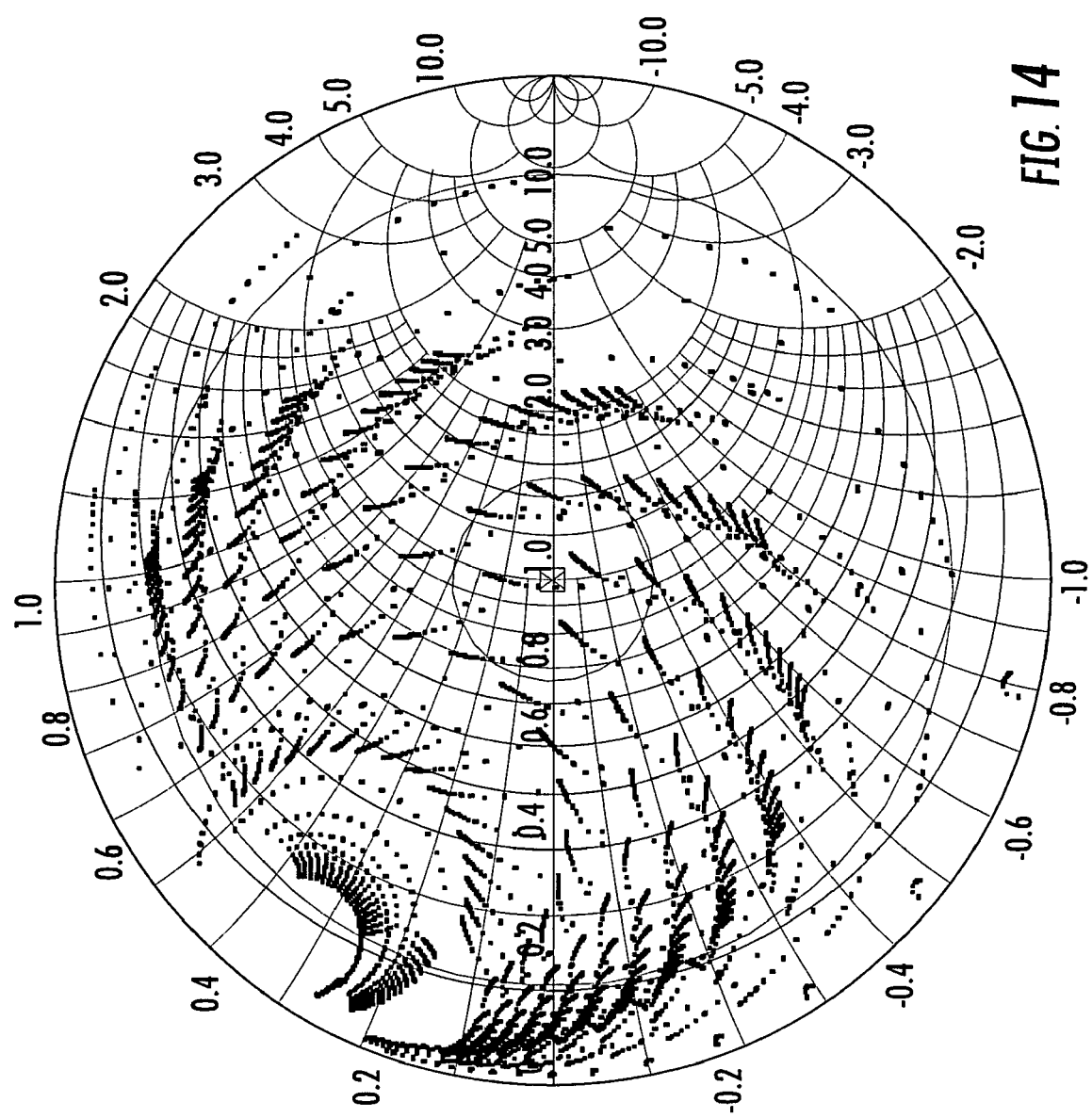
Figure 15:
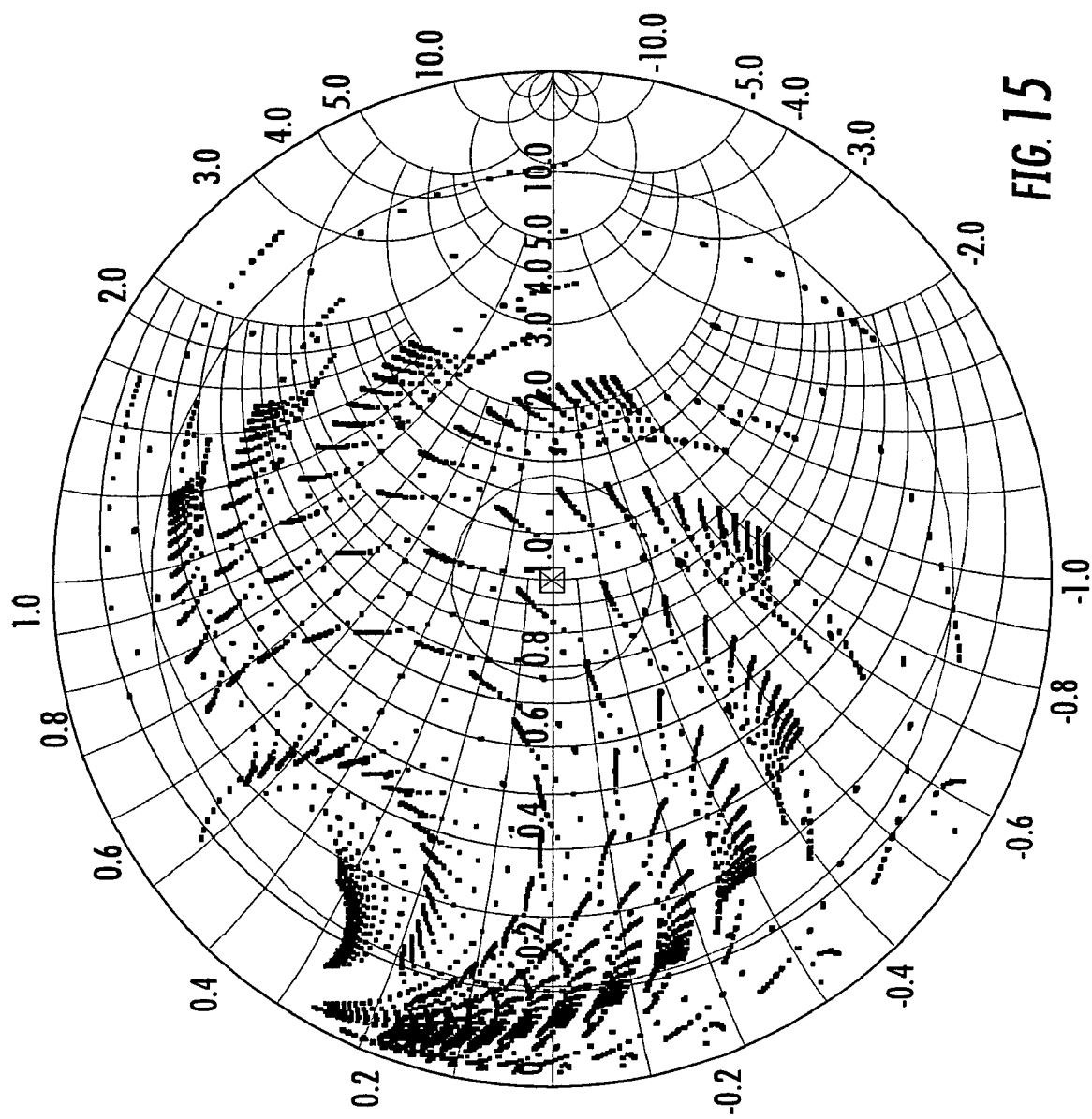
Figure 16:
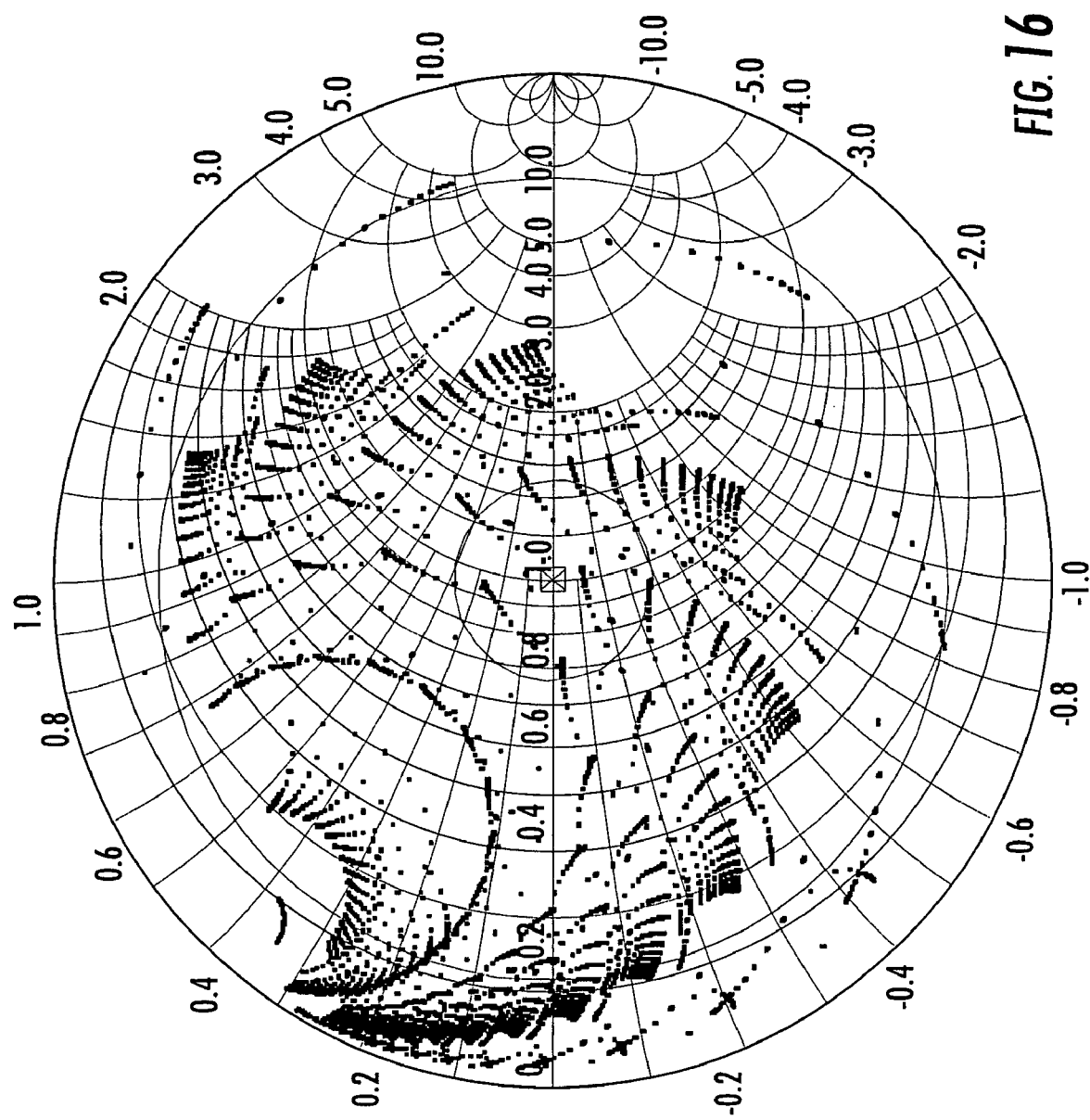

FIGS. 12-16 show the results of the reflection looking into one terminal of system 200 while the other terminal end is connected to a perfectly matched load. Further, the charts of FIGS. 12-16 include two circles, an outer circle and an inner circle. The outer circle is a particular reflection specification limit where the network should ideally fill the circle with coverage so it can match any load with reflection smaller than the specification limit. The inner circle is the reflection specification limit for sufficient match. FIGS. 14-16 illustrate the tuning capability of this network for multiple operational frequencies (1.7, 1.9 and 2.1 GHz respectively).

Figure 17:
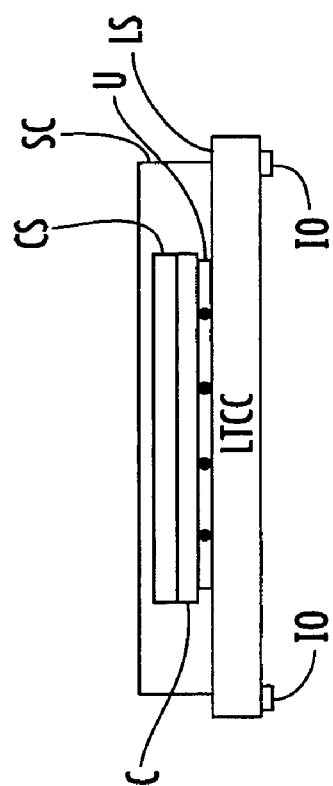
FIG. 17 is one physical implementation of such a tunable matching circuit.

FIG. 17 is a cross-sectional side view of a tuner implementation using MEMS tunable capacitors C on a die according to an embodiment of the subject matter described herein. Referring to FIG. 17, capacitors C can be on a die that is flip-chipped onto an LTCC substrate LS. Substrate LS can contain the high-impedance elements and input/output 10 connections to a circuit board. Control CMOS CS may be monolithically integrated with capacitors C. An underfill U can be disposed between capacitors C and substrate LS. Further, a shield cover SC can be positioned on substrate LS and over underfill U, capacitors C, and CMOS CS.

Figure 18:
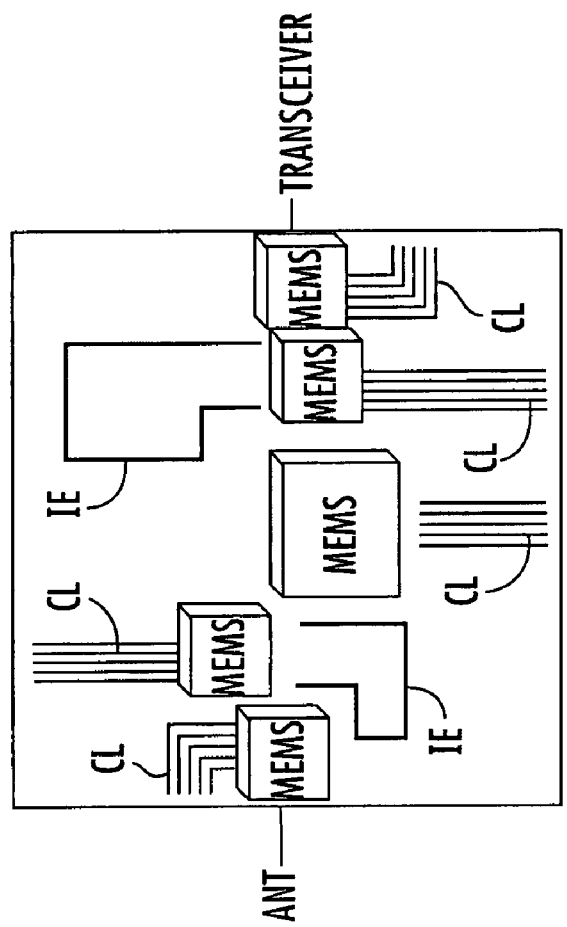
FIG. 18 is a block diagram of a MEMS-based tunable capacitor implementation of the matching circuit shown in FIG. 1B.

FIG. 18 is a block diagram of a tuner generally designated 2500 according to an embodiment of the subject matter described herein. Referring to FIG. 18, tuner 1800 can include high impedance elements (transmission lines in this example) IE. Further, tuner 1800 includes MEMS and their control lines CL. Control lines CL can be used to set the tunable capacitor states. Control lines CL can correspond to impedance elements, such as the impedance elements described with respect to FIG. 1B.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A plurality of tunable impedance matching networks connected in an in-line series combination, each of the tunable impedance matching networks comprising:
   (a) a substrate having an impedance element, the impedance element being connected between first and second nodes for communicating signals between the first and second nodes;
   (b) a first capacitor connected in parallel with the impedance element, wherein the first capacitor is tunable;
   (c) a second capacitor comprising first and second terminals, wherein the first terminal of the second capacitor is connected to the first node, wherein the second terminal of the second capacitor is connected to a third node, and wherein the third node is a ground; and
   (d) a third capacitor comprising first and second terminals, wherein the first terminal of the third capacitor is connected to the second node, wherein the second terminal of the third capacitor is connected to a fourth node, and wherein the fourth node is a local voltage reference for the second node;
   wherein at least one of the first, second, and third capacitors comprises a micro-electro-mechanical system (MEMS) variable capacitor;
   wherein at least one of the first, second, and third capacitors is flip-chipped onto the substrate; and
   wherein adjacent networks in the series are connected at the first node of one network and the second node of an adjacent network.

2. The tunable impedance matching network of claim 1 wherein the impedance element comprises a transmission line.

3. The tunable impedance matching network of claim 1 wherein the impedance element comprises an inductor.

4. The tunable impedance matching network of claim 1 wherein at least one of the second and third capacitors is tunable.

5. The tunable impedance matching network of claim 1 wherein the second and third capacitors are tunable.

6. The tunable impedance matching network of claim 1 wherein the first, second, and third capacitors comprise micro-electro-mechanical system (MEMS) variable capacitors.

7. The tunable impedance matching network of claim 6 wherein the first, second, and third capacitors are flip-chipped onto the substrate; and
   wherein the substrate comprises a low temperature co-fired ceramic (LTCC) substrate.

8. The tunable impedance matching network of claim 6 wherein the substrate comprises a low temperature co-fired ceramic (LTCC) substrate.

9. The tunable impedance matching network of claim 1 wherein the second terminal of the third capacitor is connected to a ground.

10. The tunable impedance matching network of claim 1 wherein parallel shunt capacitors from each of the adjacent networks are combined into single capacitors.

11. A plurality of the tunable impedance matching networks connected in an in-line series combination, each of the tunable impedance matching networks comprising:
   (a) a substrate having first and second impedance elements, the first and second impedance elements being connected in series between first and second nodes for communicating signals between the first and second nodes;
   (b) first and second capacitors connected in parallel with the first and second impedance elements, respectively;
   (c) a third capacitor comprising first and second terminals, wherein the first terminal is connected at a connection node between the first and second impedance elements, wherein the second terminal is connected to a third node, and wherein the third node is a local voltage reference for the connection node;
   wherein at least one of the first, second, and third capacitors comprises a micro-electro-mechanical system (MEMS) variable capacitor;
   wherein at least one of the first, second, and third capacitors is flip-chipped onto the substrate; and
   wherein adjacent networks in the series are connected at a first node of one network and a second node of an adjacent network.

12. The tunable impedance matching network of claim 11 wherein the first and second impedance elements comprise a transmission line.

13. The tunable impedance matching network of claim 11 wherein the first and second impedance elements comprise an inductor.

14. The tunable impedance matching network of claim 11 wherein at least one of the first, second, and third capacitors is tunable.

15. The tunable impedance matching network of claim 11 wherein the first, second, and third capacitors are tunable.

16. The tunable impedance matching network of claim 11 wherein the first, second, and third capacitors comprise micro-electro-mechanical system (MEMS) variable capacitors.

17. The tunable impedance matching network of claim 16 wherein the first, second, and third capacitors are flip-chipped onto the substrate; and wherein the substrate comprises a low temperature co-fired ceramic (LTCC) substrate.

18. The tunable impedance matching network of claim 16 wherein the substrate comprises a low temperature co-fired ceramic (LTCC) substrate comprising the first and second impedance elements.

19. The tunable impedance matching network of claim 11 wherein the second terminal of the third capacitor is connected to a ground.

20. The tunable impedance matching network of claim 11 wherein the parallel impedance elements and capacitors from each of the adjacent networks are combined into single parallel impedance element and capacitor.

21. A tunable diplexer matching system comprising:
(a) a diplexer circuit comprising first, second, and third ports;
(b) first and second tunable impedance matching networks connected to the first and second ports, respectively, wherein each of the first and second tunable impedance matching networks comprise a high pass filter section and a low pass filter section, wherein the high pass filter section comprises:
  (i) first and second variable capacitors connected in series between a first and second node; and
  (ii) a first inductor comprising first and second terminals, wherein the first terminal of the first inductor is connected at a connection node between the first and second variable capacitors, wherein the second terminal of the second capacitor is connected to a third node, and wherein the third node is a local voltage reference to the connection node between the first and second variable capacitors; and
wherein the low pass filter section comprises:
  (i) second and third inductors connected in series between the second node and a fifth node; and
  (ii) a third variable capacitor comprising first and second terminals, wherein the first terminal of the third variable capacitor is connected at a connection node between the first and second inductors, wherein the second terminal of the third variable capacitor is connected to a sixth node, and wherein the sixth node is a local voltage reference to the connection node between the first and second inductors.

22. The tunable diplexer matching system of claim 21 wherein at least one of the first, second, and third capacitors comprises a micro-electro-mechanical system (MEMS) variable capacitor.

23. The diplexer system of claim 21 wherein the first, second, and third capacitors comprise micro-electro-mechanical system (MEMS) variable capacitors.

24. The tunable impedance matching network of claim 23 wherein the first, second, and third capacitors are flip-chipped onto a low temperature co-fired ceramic (LTCC) substrate.

25. The tunable impedance matching network of claim 23 wherein at least one of the first, second, and third capacitors is flip-chipped onto a low temperature co-fired ceramic (LTCC) substrate.

26. A tunable diplexer matching system comprising:
(a) a diplexer circuit comprising first, second, and third ports;
(b) first and second tunable impedance matching networks connected to the first and second ports, respectively, wherein each of the first and second tunable impedance matching networks comprise:
  (i) an impedance element connected between first and second nodes for communicating signals between the first and second nodes;
  (ii) a first capacitor connected in parallel with the impedance element, wherein the first capacitor is tunable;
  (iii) a second capacitor comprising first and second terminals, wherein the first terminal of the second capacitor is connected to the first node, wherein the second terminal of the second capacitor is connected to a third node, and wherein the third node is a local voltage reference for the first node; and
  (iv) a third capacitor comprising first and second terminals, wherein the first terminal of the third capacitor is connected to the second node, wherein the second terminal of the third capacitor is connected to a fourth node, and wherein the fourth node is a local voltage reference for the second node.

27. The tunable diplexer matching system of claim 26 wherein at least one of the first, second, and third capacitors comprises a micro-electro-mechanical system (MEMS) variable capacitor.

28. The tunable impedance matching system of claim 27 wherein the at least one of the first, second, and third capacitors is flip-chipped onto a low temperature co-fired ceramic (LTCC) substrate comprising the impedance element.

29. The tunable diplexer matching system of claim 26 wherein the first, second, and third capacitors comprise micro-electro-mechanical system (MEMS) variable capacitors.

30. The tunable impedance matching system of claim 27 wherein the first, second, and third capacitors are flip-chipped onto a low temperature co-fired ceramic (LTCC) substrate comprising the impedance element.

* * * * *